United States Patent
Matsushima

(10) Patent No.: US 8,907,358 B2
(45) Date of Patent: *Dec. 9, 2014

(54) ORGANIC LIGHT-EMITTING PANEL, MANUFACTURING METHOD THEREOF, AND ORGANIC DISPLAY DEVICE

(71) Applicant: Panasonic Corporation, Osaka (JP)
(72) Inventor: Hideaki Matsushima, Osaka (JP)
(73) Assignee: Panasonic Corporation, Osaka (JP)
( * ) Notice: Subject to any disclaimer, the term of this patent is extended or adjusted under 35 U.S.C. 154(b) by 86 days.

This patent is subject to a terminal disclaimer.

(21) Appl. No.: 13/716,744
(22) Filed: Dec. 17, 2012
(65) Prior Publication Data

US 2013/0105782 A1 May 2, 2013

Related U.S. Application Data

(63) Continuation of application No. PCT/JP2010/006143, filed on Oct. 15, 2010.

(51) Int. Cl.

| | | |
|---|---|---|
| H01L 29/18 | (2006.01) | |
| H01L 29/20 | (2006.01) | |
| H01L 33/00 | (2010.01) | |
| H01L 29/08 | (2006.01) | |
| H01L 21/00 | (2006.01) | |
| H01L 51/50 | (2006.01) | |
| H01L 27/32 | (2006.01) | |
| H01L 33/08 | (2010.01) | |
| H01L 51/56 | (2006.01) | |
| H01L 51/00 | (2006.01) | |
| H01L 51/52 | (2006.01) | |

(52) U.S. Cl.
CPC ............ *H01L 51/50* (2013.01); *H01L 27/3246* (2013.01); *H01L 33/08* (2013.01); *H01L 51/56* (2013.01); *H01L 51/0005* (2013.01); *H01L 27/3211* (2013.01); *H01L 51/5228* (2013.01); *H01L 51/5234* (2013.01)
USPC .......... 257/89; 257/88; 257/40; 257/E51.018; 257/E51.022; 438/34; 438/35

(58) Field of Classification Search
CPC ............ H01L 27/3246; H01L 27/3211; H01L 27/3276; H01L 27/3283; H01L 27/3295; H01L 51/0005; H01L 51/50; H01L 51/56; H01L 51/5228; H01L 51/5234; H01L 33/08
USPC ................ 257/40, 88, 89, E27.119, E51.018, 257/E51.022; 438/28, 34, 35; 315/504
See application file for complete search history.

(56) References Cited

U.S. PATENT DOCUMENTS 5,443,922 A 8/1995 Nishizaki et al.
5,925,087 A 7/1999 Ohnishi et al.
(Continued)

FOREIGN PATENT DOCUMENTS

CN 1345469 4/2002
CN 101091231 12/2007
(Continued)

OTHER PUBLICATIONS

United States Office Action in U.S. Appl. No. 13/091,652, dated Mar. 26, 2013.
(Continued)

*Primary Examiner* — Fernando L Toledo
*Assistant Examiner* — Aaron Gray
(74) *Attorney, Agent, or Firm* — Greenblum & Bernstein, P.L.C.

(57) ABSTRACT

A pixel in the panel includes sub-pixels 100a, 100b, and 100c. Bank 105a separates organic light-emitting layer of sub-pixel 100a and organic light-emitting layer of a sub-pixel of a pixel that is adjacent to sub-pixel 100a. Bank 105d separates organic light-emitting layer of sub-pixel 100c and organic light-emitting layer of a sub-pixel of a pixel that is adjacent to sub-pixel 100c. Bank 105b separates organic light-emitting layer of sub-pixel 100a and organic light-emitting layer of sub-pixel 100b. Bank 105c separates organic light-emitting layer of sub-pixel 100b and organic light-emitting layer of sub-pixel 100c. Inclination angle θcb of sidewall 105cb of bank 105c located on the side of sub-pixel 100c is set to be larger than other inclination angles θaa, θba, θbb, θcc and θdc.

37 Claims, 26 Drawing Sheets

(56) References Cited

U.S. PATENT DOCUMENTS

| | | | |
|---|---|---|---|
| 6,388,377 B1 | 5/2002 | Kobayashi et al. | |
| 6,559,604 B2 | 5/2003 | Lu et al. | |
| 6,762,552 B1 | 7/2004 | Duineveld et al. | |
| 7,034,453 B2 | 4/2006 | Kai et al. | |
| 7,038,651 B2 | 5/2006 | Nitta et al. | |
| 7,214,959 B2 | 5/2007 | Seki et al. | |
| 7,307,381 B2 | 12/2007 | Ito et al. | |
| 7,332,854 B2 | 2/2008 | Kai et al. | |
| 7,352,350 B2 | 4/2008 | Nitta et al. | |
| 7,642,701 B2 | 1/2010 | Kai et al. | |
| 7,932,518 B2 | 4/2011 | Seki et al. | |
| 7,994,711 B2 | 8/2011 | Nakamura et al. | |
| 8,129,902 B2 | 3/2012 | Kai et al. | |
| 8,193,699 B2 | 6/2012 | Fujioka et al. | |
| 8,536,589 B2 * | 9/2013 | Matsushima | 257/88 |
| 8,546,820 B2 * | 10/2013 | Matsushima | 257/88 |
| 8,604,492 B2 * | 12/2013 | Matsushima | 257/89 |
| 8,604,493 B2 * | 12/2013 | Matsushima | 257/89 |
| 8,604,494 B2 * | 12/2013 | Matsushima | 257/89 |
| 8,604,495 B2 * | 12/2013 | Matsushima | 257/89 |
| 8,624,275 B2 * | 1/2014 | Matsushima | 257/89 |
| 2001/0035393 A1 | 11/2001 | Lu et al. | |
| 2002/0064966 A1 | 5/2002 | Seki et al. | |
| 2002/0079833 A1 | 6/2002 | Kobayashi et al. | |
| 2002/0158835 A1 * | 10/2002 | Kobayashi et al. | 345/100 |
| 2003/0179221 A1 | 9/2003 | Nitta et al. | |
| 2004/0021413 A1 * | 2/2004 | Ito et al. | 313/504 |
| 2004/0119419 A1 | 6/2004 | Kai et al. | |
| 2004/0166761 A1 | 8/2004 | Seki et al. | |
| 2005/0237780 A1 | 10/2005 | Sakai | |
| 2005/0264186 A1 | 12/2005 | Seki et al. | |
| 2005/0264187 A1 | 12/2005 | Seki et al. | |
| 2005/0266169 A1 | 12/2005 | Seki et al. | |
| 2006/0158107 A1 | 7/2006 | Kai et al. | |
| 2006/0176261 A1 | 8/2006 | Nitta et al. | |
| 2006/0283384 A1 | 12/2006 | Yamazaki et al. | |
| 2007/0018152 A1 | 1/2007 | Seki et al. | |
| 2007/0029929 A1 | 2/2007 | Nakamura et al. | |
| 2007/0241664 A1 | 10/2007 | Sakamoto et al. | |
| 2008/0036374 A1 | 2/2008 | Okano | |
| 2008/0290789 A1 | 11/2008 | Kai et al. | |
| 2008/0309221 A1 | 12/2008 | Lang et al. | |
| 2008/0315760 A1 | 12/2008 | Seki et al. | |
| 2009/0009075 A1 | 1/2009 | Seki et al. | |
| 2009/0096364 A1 | 4/2009 | Fujii et al. | |
| 2009/0115318 A1 | 5/2009 | Gregory et al. | |
| 2009/0160322 A1 | 6/2009 | Yoshida et al. | |
| 2009/0284144 A1 | 11/2009 | Fujioka et al. | |
| 2009/0302333 A1 | 12/2009 | Seki et al. | |
| 2010/0102343 A1 | 4/2010 | Ono et al. | |
| 2010/0164372 A1 | 7/2010 | Kai et al. | |
| 2011/0180821 A1 | 7/2011 | Matsushima | |
| 2011/0198623 A1 | 8/2011 | Matsushima | |
| 2011/0198624 A1 | 8/2011 | Matsushima | |
| 2012/0025699 A1 | 2/2012 | Okumoto et al. | |
| 2012/0091440 A1 | 4/2012 | Matsushima | |
| 2012/0091441 A1 | 4/2012 | Matsushima | |
| 2012/0091483 A1 | 4/2012 | Matsushima | |
| 2012/0138973 A1 | 6/2012 | Matsushima | |
| 2012/0193658 A1 | 8/2012 | Matsushima | |

FOREIGN PATENT DOCUMENTS

| | | |
|---|---|---|
| GB | 2391686 | 2/2004 |
| JP | 05-163488 | 6/1993 |
| JP | 10-133194 | 5/1998 |
| JP | 2002-222695 | 8/2002 |
| JP | 2002-358983 | 12/2002 |
| JP | 2004-192935 | 7/2004 |
| JP | 2005-267984 | 9/2005 |
| JP | 2006-140205 | 6/2006 |
| JP | 2006-185869 | 7/2006 |
| JP | 2007-073499 | 3/2007 |
| JP | 2007-165167 | 6/2007 |
| JP | 2007-287354 | 11/2007 |
| JP | 2007-310156 | 11/2007 |
| JP | 2007-311235 | 11/2007 |
| JP | 2009-054608 | 3/2009 |
| JP | 2009-277578 | 11/2009 |
| JP | 2009-277590 | 11/2009 |
| JP | 2010-225515 | 10/2010 |
| TW | 461228 | 10/2001 |
| WO | 99/12397 | 3/1999 |
| WO | 2006/054421 | 5/2006 |
| WO | 2008/105153 | 9/2008 |

OTHER PUBLICATIONS

United States Office Action in U.S. Appl. No. 13/082,674, dated Mar. 21, 2013.

United States Office Action in U.S. Appl. No. 13/091,667, dated Mar. 25, 2013.

United States Office Action in U.S. Appl. No. 13/313,214, dated Mar. 12, 2013.

United States Office Action in U.S. Appl. No. 13/309,775, dated Mar. 4, 2013.

United States Office Action in U.S. Appl. No. 13/309,768, dated Feb. 28, 2013.

United States Office Action in U.S. Appl. No. 13/313,206, dated Mar. 5, 2013.

United States Office Action in U.S. Appl. No. 13/434,070, dated Apr. 26, 2013.

Notice of Allowance in U.S. Appl. No. 13/082,674, dated Jun. 17, 2013.

Notice of Allowance in U.S. Appl. No. 13/091,667, dated Jun. 12, 2013.

Korean Office Action from Korean Patent Office in Korean Patent Application No. 2011-7029074, dated May 27, 2013.

Notice of Allowance in U.S. Appl. No. 13/091,652, dated Jun. 27, 2013.

United States Office Action in U.S. Appl. No. 13/313,214, dated Jul. 8, 2013.

United States Office Action in U.S. Appl. No. 13/309,775, dated Jul. 8, 2013.

United States Office Action in U.S. Appl. No. 13/309,768, dated Jul. 8, 2013.

United States Office Action in U.S. Appl. No. 13/313,206, dated Jul. 8, 2013.

U.S. Appl. No. 13/091,652 to Hideaki Matsushima, filed Apr. 21, 2011.

U.S. Appl. No. 13/082,674 to Hideaki Matsushima, filed Apr. 8, 2011.

U.S. Appl. No. 13/091,667 to Hideaki Matsushima, filed Apr. 21, 2011.

U.S. Appl. No. 13/434,070 to Hideaki Matsushima, filed Mar. 29, 2012.

U.S. Appl. No. 13/717,930 to Hideaki Matsushima, filed Dec. 28, 2012.

U.S. Appl. No. 13/313,214 to Hideaki Matsushima, filed Dec. 7, 2011.

U.S. Appl. No. 13/309,775 to Hideaki Matsushima, filed Dec. 2, 2011.

U.S. Appl. No. 13/309,768 to Hideaki Matsushima, filed Dec. 2, 2011.

U.S. Appl. No. 13/313,206 to Hideaki Matsushima, filed Dec. 7, 2011.

International Search Report in PCT/JP2009/007118, mailing date of Mar. 2, 2010.

International Search Report in PCT/JP2009/007082, mailing date of Mar. 2, 2010.

International Search Report in PCT/JP2009/007092, mailing date of Mar. 2, 2010.

International Search Report in PCT/JP2010/006126, mailing date of Jan. 18, 2011.

International Search Report in PCT/JP2010/006139, mailing date of Jan. 18, 2011.

International Search Report in PCT/JP2010/006144, mailing date of Jan. 18, 2011.

(56) References Cited

OTHER PUBLICATIONS

International Search Report in PCT/JP2010/006145, mailing date of Jan. 18, 2011.
United States Office Action in U.S. Appl. No. 13/091,667, dated Oct. 17, 2012.
International Search Report in PCT/JP2010/006125, mailing date of Dec. 7, 2010.
International Search Report in PCT/JP2010/006143, mailing date of Jan. 11, 2011.
International Preliminary Examination Report in PCT/JP2010/006125, mailing date of Dec. 12, 2011.
International Preliminary Examination Report in PCT/JP2010/006143, mailing date of Dec. 8, 2011.
United States Office Action in U.S. Appl. No. 13/082,674, dated Oct. 17, 2012.
International Search Report in PCT/JP2010/006149, mailing date of Dec. 28, 2010.
China Office Action from the Patent Office of the People's Republic of China in Chinese Patent Application No. 200980123226.8, dated Apr. 23, 2014, together with a partial English language translation.
China Office Action from the Patent Office of the People's Republic of China in Chinese Patent Application No. 201080036469.0, dated Apr. 1, 2014, together with a partial English language translation.
Notice of Allowance in U.S. Appl. No. 13/434,070, dated Sep. 4, 2013.
Notice of Allowance in U.S. Appl. No. 13/313,214, dated Sep. 20, 2013.
Notice of Allowance in U.S. Appl. No. 13/309,775, dated Sep. 23, 2013.
Notice of Allowance in U.S. Appl. No. 13/309,768, dated Sep. 23, 2013.
Notice of Allowance in U.S. Appl. No. 13/313,206, dated Sep. 19, 2013.
China Office Action from the Patent Office of the People's Republic of China in Chinese Patent Application No. 200980123227.2, dated May 5, 2014, together with a partial English language translation.
China Office Action from the Patent Office of the People's Republic of China in Chinese Patent Application No. 200980123220.0, dated Jun. 12, 2014, together with a partial English language translation.
Restriction Requirement from United States Patent and Trademark Office (USPTO) in U.S. Appl. No. 13/717,930, dated Jul. 9, 2014.

* cited by examiner

FIG. 6

| Taper angle (θ) | Small ←——————————————→ Large |
|---|---|
| Pinning location (H) | Low ←——————————————→ High |
| Film thickness (T) | Thick ←——————————————→ Thin |

FIG. 8

| | Sample 4 | Sample 5 |
|---|---|---|
| Bank height [μm] | 0.7 | 1.0 |
| Contact angle [°] | 43 | 47 |
| Taper angle [°] | 28 | 50 |
| Film thickness distribution | (Horizontal direction vs. Direction of height) | (Horizontal direction vs. Direction of height) |

FIG. 11A
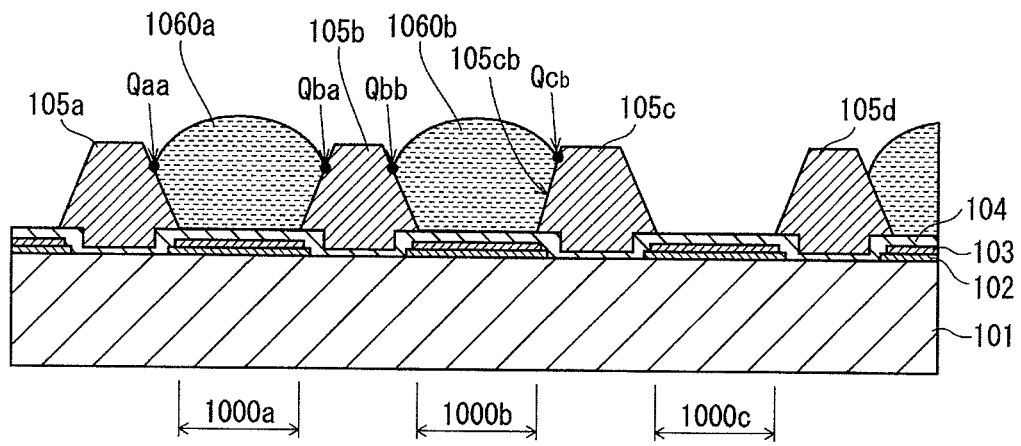
FIG. 11B
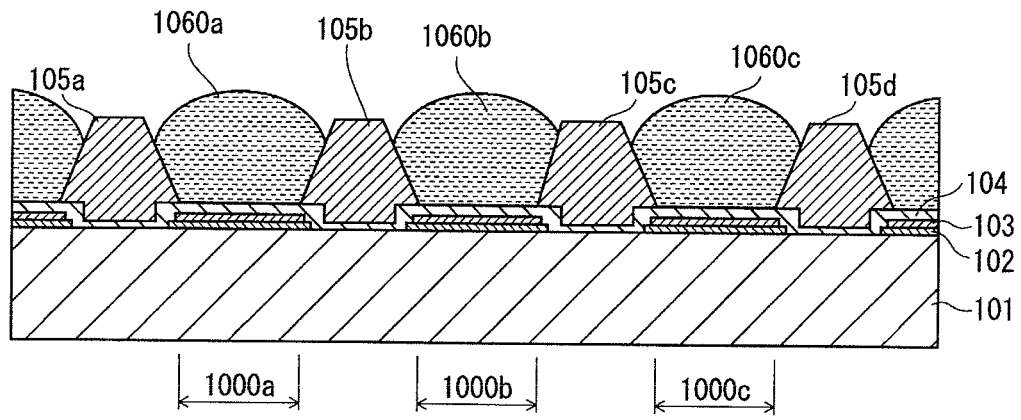
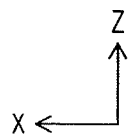

FIG. 14A
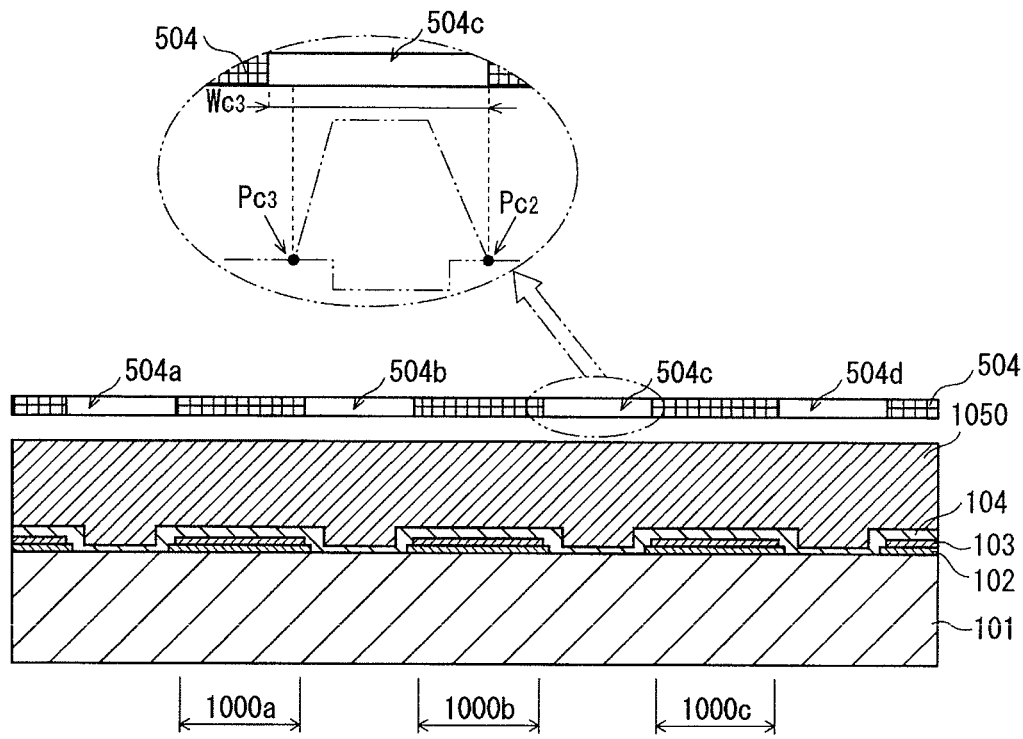
FIG. 14B
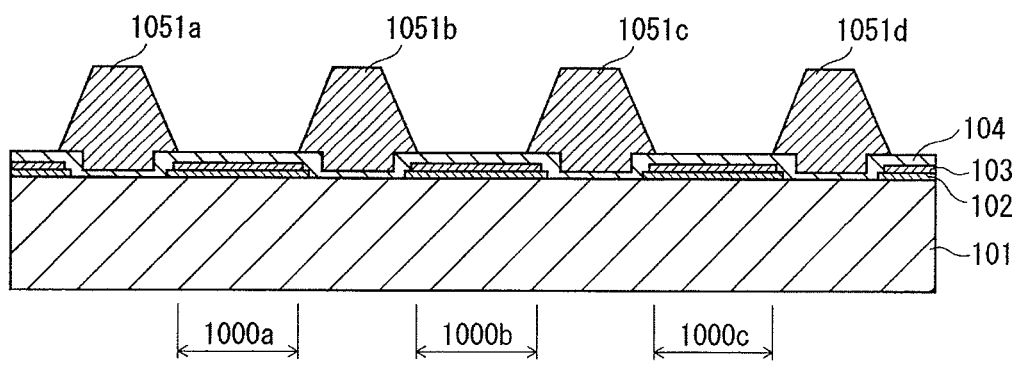
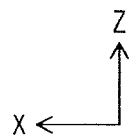

FIG. 15A
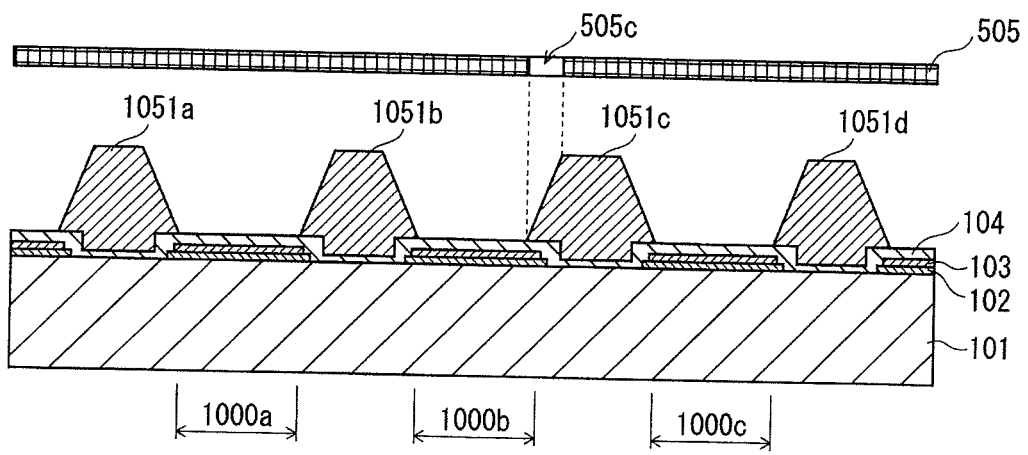
FIG. 15B
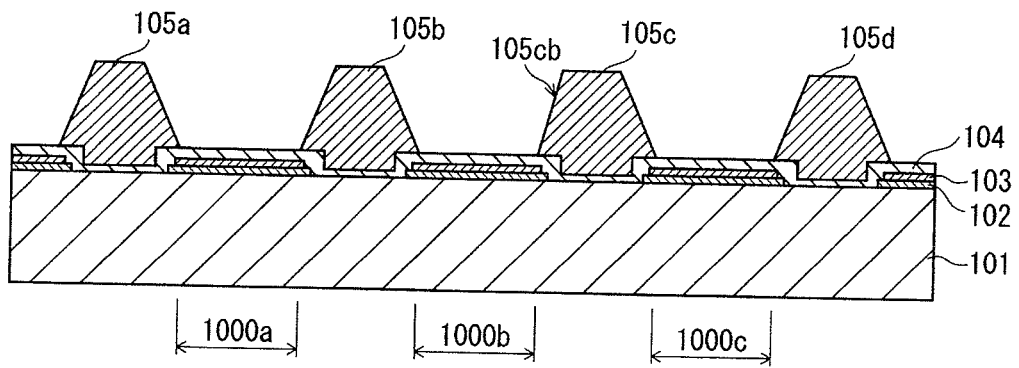
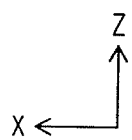

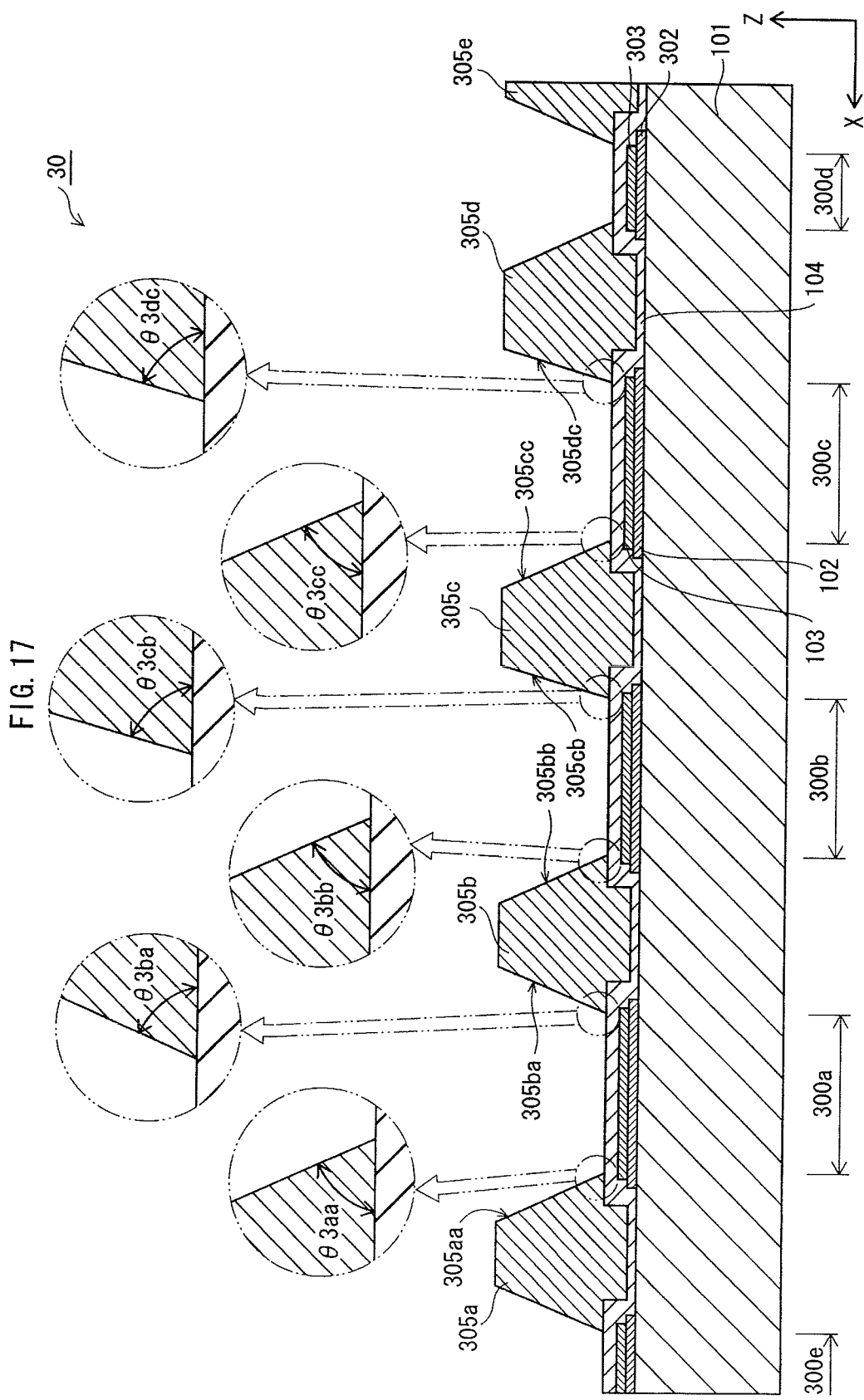

ORGANIC LIGHT-EMITTING PANEL, MANUFACTURING METHOD THEREOF, AND ORGANIC DISPLAY DEVICE

This is a continuation application of PCT Application No. PCT/JP2010/006143 filed on Oct. 15, 2010, designating the United States of America, the disclosure of which, including the specification, drawings and claims, is incorporated herein by reference in its entirety.

TECHNICAL FIELD

The present invention relates an organic light-emitting panel, a manufacturing method thereof, and an organic display device.

BACKGROUND ART

In recent years, progress has been made in the research and development of display devices that use the phenomenon of electroluminescence occurring in organic material. Each light-emitting cell of such a display device is composed of an anode and a cathode with an organic light-emitting layer therebetween. When the display device is driven, holes are injected through the anode, electrons are injected through the cathode, and the holes and electrons recombine within the organic light-emitting layer, thereby emitting the light.

Banks composed of insulating material partition the organic light-emitting layer into light-emitting cells. The organic light-emitting layer is formed by dripping ink, which includes an organic light-emitting material, into each region separated by the banks and drying the ink.

Meanwhile, a problem with the organic light-emitting layer formed in this way is that it is difficult for the layer to have a uniform film thickness.

As one example of technologies for evening out the film thickness of the organic light-emitting layer, Patent Literature 1 discloses providing a convexity on the inner sidewall of the bank in order to control the pinning location of the ink. In other words, according to the technology of Patent Literature 1, the pinning location of the ink dripped in one light-emitting cell can be set to the convexity. With this technology, it is possible to secure a uniform film thickness to a certain degree.

CITATION LIST

Patent Literature

Patent Literature 1: Japanese Patent Application Publication No. 2007-311235

SUMMARY OF INVENTION

Technical Problem

It is considered difficult, however, to use the technology of Patent Literature 1 to detect in advance how the organic light-emitting layer of a display device is uneven in film thickness and, based on the detection results, form a minute convexity for each region or each inner sidewall of the bank to a high degree of precision. Therefore, it is not easy to maintain the organic light-emitting layer at a uniform film thickness over the entire region of the organic light-emitting panel.

It is an object of the present invention to solve the above problems by providing a display device, and a manufacturing method thereof, that has a uniform film thickness in the organic light-emitting layer across the entire panel and has an even luminance within the panel.

Solution to Problem

In order to solve the above problems, an organic light-emitting panel according to an aspect of the present invention has the following structure.

The organic light-emitting panel according to an aspect of the present invention comprises: an array of a plurality of pixels; a plurality of light-emitting cells which, provided in each pixel and arranged in an alignment, emit light of different colors, each light-emitting cell including an underlying layer, a first electrode provided in the underlying layer, an organic light-emitting layer, and a second electrode formed on an opposite side of the organic light-emitting layer from the underlying layer; and a plurality of banks which, formed above the underlying layer, define each light-emitting cell by separating the light-emitting cells one from another, the plurality of pixels including a pixel that is structured such that two inner sidewalls, which face each other in two adjacent banks defining a predetermined light-emitting cell among the plurality of light-emitting cells, have different inclination angles.

Advantageous Effects of Invention

The above organic light-emitting panel according to an aspect of the present invention is structured such that two inner sidewalls, which face each other in two adjacent banks defining the predetermined light-emitting cell, have different inclination angles. This structure makes it possible to adjust the pinning location when ink is dripped during the manufacturing. To be more specific, the larger the inclination angle of a sidewall of a bank is, the higher the pinning location is; and the smaller the inclination angle of a sidewall of a bank is, the lower the pinning location is.

Also, after the ink is dried, the film thickness of the organic light-emitting layer and the inclination angle of the bank sidewall have a reverse relationship. More specifically, the larger the inclination angle of a sidewall of a bank is, the smaller the film thickness of the organic light-emitting layer near the sidewall is, relatively; and the smaller the inclination angle of a sidewall of a bank is, the larger the film thickness of the organic light-emitting layer near the sidewall is, relatively.

Thus, with the structure where two inner sidewalls, which face each other in two adjacent banks defining the predetermined light-emitting cell, have different inclination angles, the organic light-emitting panel according to an aspect of the present invention can prevent the organic light-emitting layer in each light-emitting cell from becoming uneven in film thickness and provide excellent light-emitting characteristics.

BRIEF DESCRIPTION OF DRAWINGS

FIG. 6 summarizes the relationship between the inclination angle of the bank sidewall (taper angle) θ, the pinning height H, and the film thickness T of the organic light-emitting layer.

FIG. 8 shows a distribution of film thickness of the organic light-emitting layer in samples 4 and 5.

FIGS. 11A and 11B are schematic cross-sectional views showing, in order, the main processes in the manufacturing method of the display panel 10.

FIGS. 14A and 14B are schematic cross-sectional views showing the main processes in the manufacturing method of Modification 2.

FIGS. 15A and 15B are schematic cross-sectional views showing the main processes in the manufacturing method of Modification 2.

FIG. 17 is a schematic cross-sectional view showing the structure of sub-pixels 300a-300c, non-light-emitting cells 300d and 300e, and banks 305a-305e included in the display panel provided in the organic light-emitting device of Embodiment 2.

DESCRIPTION OF EMBODIMENTS

[Outline of Aspects of Present Invention]

Figure 1:
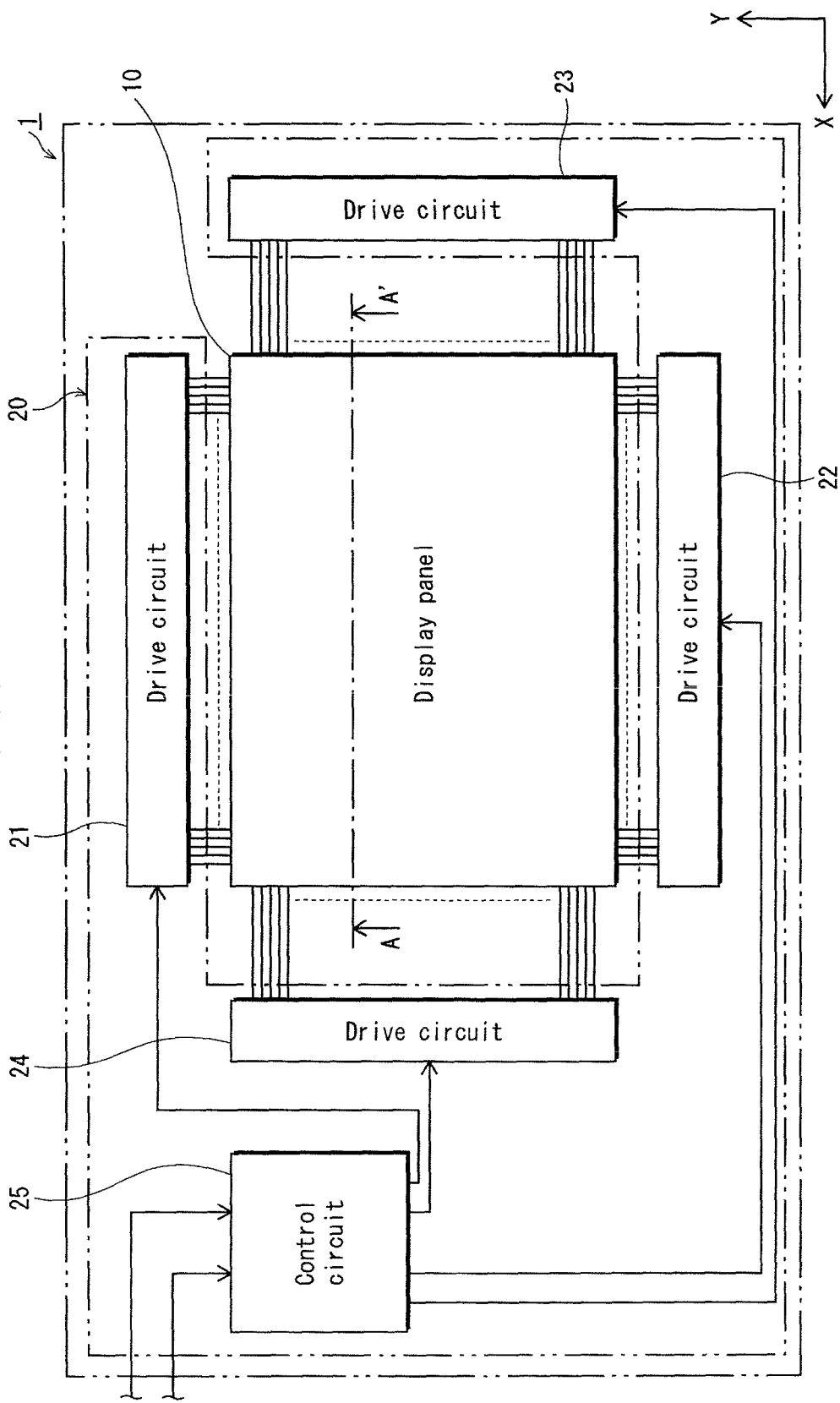
FIG. 1 is a block diagram showing the configuration of an organic display device 1 according to the Embodiment of the present invention.

The organic light-emitting panel according to an aspect of the present invention comprises: an array of a plurality of pixels; a plurality of light-emitting cells which, provided in each pixel and arranged in an alignment, emit light of different colors, each light-emitting cell including an underlying layer, a first electrode provided in the underlying layer, an organic light-emitting layer, and a second electrode formed on an opposite side of the organic light-emitting layer from the underlying layer; and a plurality of banks which, formed above the underlying layer, define each light-emitting cell by separating the light-emitting cells one from another, the plurality of pixels including a pixel that is structured such that two inner sidewalls, which face each other in two adjacent banks defining a predetermined light-emitting cell among the plurality of light-emitting cells, have different inclination angles.

The organic light-emitting panel according to an aspect of the present invention is structured such that two inner sidewalls, which face each other in two adjacent banks defining the predetermined light-emitting cell, have different inclination angles. This structure makes it possible to adjust the pinning location when ink is dripped during the manufacturing. To be more specific, the larger the inclination angle of a sidewall of a bank is, the higher the pinning location is; and the smaller the inclination angle of a sidewall of a bank is, the lower the pinning location is.

Also, after the ink is dried, the film thickness of the organic light-emitting layer and the inclination angle of the bank sidewall have a reverse relationship. More specifically, the larger the inclination angle of a sidewall of a bank is, the smaller the film thickness of the organic light-emitting layer near the sidewall is, relatively; and the smaller the inclination angle of a sidewall of a bank is, the larger the film thickness of the organic light-emitting layer near the sidewall is, relatively.

Thus, with the structure where two inner sidewalls, which face each other in two adjacent banks defining the predetermined light-emitting cell, have different inclination angles, the organic light-emitting panel according to an aspect of the present invention can prevent the organic light-emitting layer in each light-emitting cell from becoming uneven in film thickness and provide excellent light-emitting characteristics.

Note that, in the above description, the "inclination angle" is an angle formed by a side wall of a bank and an upper surface of an underlying layer on which the bank is provided (the underlying layer corresponds to the first electrode, hole injection layer, hole transporting layer, or hole injection transporting layer).

In the above-described organic light-emitting panel, in each of one or more light-emitting cells other than the predetermined light-emitting cell in the pixel that is structured such that the two inner sidewalls facing each other in the two adjacent banks defining the predetermined light-emitting cell have different inclination angles, two inner sidewalls facing each other may have equal inclination angles.

As described above, with the structure where two inner sidewalls, which face each other in two adjacent banks defining the predetermined light-emitting cell, have different inclination angles, the organic light-emitting panel according to an aspect of the present invention can prevent the organic light-emitting layer in each light-emitting cell from becoming uneven in film thickness and provide excellent light-emitting characteristics. In addition, with the above-described structure where, in each of one or more light-emitting cells other than the predetermined light-emitting cell in the pixel, two inner sidewalls facing each other have equal inclination angles, it is possible to prevent the organic light-emitting layer from becoming uneven in film thickness and provide excellent light-emitting characteristics. This makes it possible to obtain excellent light-emitting characteristics in a plurality of pixels.

Note that the term "equal" above does not mean exact mathematical equivalence, but rather takes factors such as dimensional error during manufacturing of the display device into account. Specifically, the term "equal" refers to making the inclination angles equal within the range permitted in practice by the difference in luminous efficiency (uneven luminance) between the light-emitting cells in the central region and peripheral region of the panel.

In the above-described organic light-emitting panel, the plurality of light-emitting cells in each pixel may include a first light-emitting cell located at an end of the alignment, a second light-emitting cell located at a central portion of the alignment, and a third light-emitting cell located at another end of the alignment, the plurality of pixels are arranged to be continuously adjacent to each other, and the plurality of pixels include a pixel that is structured such that two inner sidewalls, which face each other in two adjacent banks defining the first light-emitting cell, have equal inclination angles, two inner sidewalls, which face each other in two adjacent banks defining the second light-emitting cell, have different inclination angles, and two inner sidewalls, which face each other in two adjacent banks defining the third light-emitting cell, have equal inclination angles.

With the above-described structure, when a non-light-emitting cell (for example, a bus bar) is not provided between each pair of adjacent pixels and ink is applied to form organic light-emitting layers in an order of the alignment, if the above-described relationships between the inner sidewalls of the banks and the inclination angles are satisfied, the present invention produces an advantageous effect that it is possible to prevent the organic light-emitting layer in each light-emitting cell from becoming uneven in film thickness and provide excellent light-emitting characteristics.

In the above-described organic light-emitting panel, the plurality of light-emitting cells in each pixel may include a first light-emitting cell located at an end of the alignment, a second light-emitting cell located at a central portion of the alignment, and a third light-emitting cell located at another end of the alignment, a non-light-emitting cell is provided between each pair of adjacent pixels, a bank is provided between each pair of a pixel and a non-light-emitting cell that are adjacent to each other, the bank separating the pixel from the non-light-emitting cell, and the plurality of pixels include a pixel that is structured such that two inner sidewalls, which face each other in two adjacent banks defining the first light-emitting cell, have equal inclination angles, two inner sidewalls, which face each other in two adjacent banks defining the second light-emitting cell, have different inclination angles, and two inner sidewalls, which face each other in two adjacent banks defining the third light-emitting cell, have different inclination angles.

With the above-described structure, when a non-light-emitting cell (for example, a bus bar) is provided between each pair of adjacent pixels and ink is applied to form organic light-emitting layers in an order of the alignment, if the above-described relationships between the inner sidewalls of the banks and the inclination angles are satisfied, the present invention produces an advantageous effect that it is possible to prevent the organic light-emitting layer in each light-emitting cell from becoming uneven in film thickness and provide excellent light-emitting characteristics.

In the above-described organic light-emitting panel, the plurality of light-emitting cells in each pixel may include a first light-emitting cell located at an end of the alignment, a second light-emitting cell located at a central portion of the alignment, and a third light-emitting cell located at another end of the alignment, a non-light-emitting cell is provided between each pair of adjacent pixels, a bank is provided between each pair of a pixel and a non-light-emitting cell that are adjacent to each other, the bank separating the pixel from the non-light-emitting cell, and the plurality of pixels include a pixel that is structured such that two inner sidewalls, which face each other in two adjacent banks defining the first light-emitting cell, have different inclination angles, two inner sidewalls, which face each other in two adjacent banks defining the second light-emitting cell, have equal inclination angles, and two inner sidewalls, which face each other in two adjacent banks defining the third light-emitting cell, have different inclination angles.

With the above-described structure, when a non-light-emitting cell (for example, a bus bar) is provided between each pair of adjacent pixels and ink is applied to form organic light-emitting layers at the same time, not in an order of the alignment, if the above-described relationships between the inner sidewalls of the banks and the inclination angles are satisfied, the present invention produces an advantageous effect that it is possible to prevent the organic light-emitting layer in each light-emitting cell from becoming uneven in film thickness and provide excellent light-emitting characteristics.

In the above-described organic light-emitting panel, each non-light-emitting cell may include none of the organic light-emitting layers and may include the second electrode and a third electrode that is made of a same material as the first electrodes, the third electrode and the second electrode being electrically connected with each other.

In an organic light-emitting panel, the second electrode, which is provided at a location upper (closer to the light extraction side) than the organic light-emitting layer, is normally made of a light-transmissive material (such as ITO or IZO). However, these materials have high electric resistance. These matters taken into account, the second electrode and the third electrode are connected in the non-light-emitting cell to reduce the electric resistance so that high light-transmissivity can be maintained to prevent a voltage drop from occurring even in a panel of a large size. The third electrode is, for example, a bus bar.

In the above-described organic light-emitting panel, two regions adjacent to the predetermined light-emitting cell may have different ink vapor concentrations when ink is applied to the predetermined light-emitting cell, and among two inner sidewalls facing each other in two adjacent banks defining the predetermined light-emitting cell, a sidewall of a bank, which is located on a side of a region having a lower ink vapor concentration among the two regions, may have a larger inclination angle than a sidewall of a bank, which is located on a side of a region having a higher ink vapor concentration among the two regions.

In the organic light-emitting panel, when ink is applied to a light-emitting cell that is adjacent to two regions having different ink vapor concentrations, the applied ink forming a light-emitting layer has an inherent tendency to be larger in film thickness at an end located on a side of a region having a lower ink vapor concentration than at an end located on a side of a region having a higher ink vapor concentration. Due to this tendency, the light-emitting layer is likely to have an uneven film thickness.

However, with the above-described structure where, a sidewall of a bank, which is located on a side of a region having a lower ink vapor concentration among the two regions, has a larger inclination angle than a sidewall of a bank, which is located on a side of a region having a higher ink vapor concentration among the two regions, the pinning location of the ink in the sidewall of the bank located on the side of the region having a lower ink vapor concentration becomes relatively higher than the pinning location of the ink in the sidewall of the bank located on the side of the region having a higher ink vapor concentration. As a result, it is possible to restrict the film thickness of the organic light-emitting layer in the sidewall of the bank on the side of the region having a lower ink vapor concentration, thereby preventing the uneven film thickness from occurring between two ends of the predetermined light-emitting cell.

Thus, with the above-described structure, it is possible to prevent the organic light-emitting layer in the predetermined light-emitting cell from becoming uneven in film thickness and provide excellent light-emitting characteristics in each pixel.

In the above-described organic light-emitting panel, a type of ink corresponding to the predetermined light-emitting cell may be applied to the predetermined light-emitting cell in a state where a type of ink corresponding to one light-emitting cell among two light-emitting cells that are adjacent to the predetermined light-emitting cell in a same pixel, has been applied to the one light-emitting cell and before another type of ink corresponding to the other light-emitting cell among the two light-emitting cells starts to be applied to the other light-emitting cell, and a sidewall of a bank located on a side of the other light-emitting cell may have a larger inclination angle than a sidewall of a bank located on a side of the one light-emitting cell.

In the organic light-emitting panel, when ink is applied to a predetermined light-emitting cell in the state where a type of ink corresponding to one light-emitting cell among two light-emitting cells that are adjacent to the predetermined light-emitting cell in a same pixel, has been applied to the one light-emitting cell and before another type of ink corresponding to the other light-emitting cell among the two light-emitting cells starts to be applied to the other light-emitting cell, the ink vapor concentration is higher on the side of the one light-emitting cell than on the side of the other light-emitting cell. Accordingly, the applied ink forming a light-emitting layer tends to be larger in film thickness at an end located on a side of the other light-emitting cell than at an end located on a side of the one light-emitting cell. Due to this tendency, the light-emitting layer is likely to have an uneven film thickness.

However, with the above-described structure where a sidewall of a bank located on a side of the other light-emitting cell has a larger inclination angle than a sidewall of a bank located on a side of the one light-emitting cell, the pinning location of the ink in the sidewall of the bank located on the side of the other light-emitting cell becomes relatively higher than the pinning location of the ink in the sidewall of the bank located on the side of the one light-emitting cell. As a result, it is possible to restrict the film thickness of the organic light-emitting layer in the sidewall of the bank located on the side of the other light-emitting cell, thereby preventing the uneven film thickness from occurring between two ends of the predetermined light-emitting cell.

Thus, with the above-described structure, it is possible to prevent the organic light-emitting layer in the predetermined light-emitting cell from becoming uneven in film thickness and provide excellent light-emitting characteristics in each pixel.

In the above-described organic light-emitting panel, two regions adjacent to the predetermined light-emitting cell may have different ink vapor concentrations when ink is applied to the predetermined light-emitting cell, and two regions adjacent to a light-emitting cell, which is different from the predetermined light-emitting cell, may have equal ink vapor concentrations when ink is applied to the light-emitting cell.

In the above-described organic light-emitting panel, the plurality of light-emitting cells provided in each pixel may include a first light-emitting cell located at an end of the alignment, a second light-emitting cell located at a central portion of the alignment, and a third light-emitting cell located at another end of the alignment, each organic light-emitting layer being formed by applying, for each pixel, three types of ink, which correspond one-to-one to the different colors of light, respectively to the three light-emitting cells in an order of the first light-emitting cell, the second light-emitting cell and the third light-emitting cell, the plurality of pixels are arranged to be continuously adjacent to each other, and in each pixel, two inner sidewalls, which face each other in two adjacent banks defining the first light-emitting cell, have equal inclination angles, two inner sidewalls, which face each other in two adjacent banks defining the second light-emitting cell, have different inclination angles, and two inner sidewalls, which face each other in two adjacent banks defining the third light-emitting cell, have equal inclination angles.

The above structure exerts an effect on the structure where a non-light-emitting cell is not provided between each pair of adjacent pixels and ink is applied in the order of the first light-emitting cell, the second light-emitting cell and the third light-emitting cell in each pixel. That is to say, in the above structure, two inner sidewalls, which face each other in two adjacent banks defining the first light-emitting cell to which ink is applied in the first round, have equal inclination angles, two inner sidewalls, which face each other in two adjacent banks defining the second light-emitting cell to which ink is applied in the second round, have different inclination angles, and two inner sidewalls, which face each other in two adjacent banks defining the third light-emitting cell to which ink is applied in the third round, have equal inclination angles. With this structure, even in the case where different ink vapor concentrations occur because ink is applied to the light-emitting cells in sequence at different timings, it is possible to effectively prevent an uneven film thickness from occurring in the organic light-emitting layer formed in each of the first, second and third light-emitting cells by adjusting the relative pinning locations of the ink in the sidewalls of the banks.

In the above-described organic light-emitting panel, among two inner sidewalls facing each other in two adjacent banks defining the second light-emitting cell, a sidewall of a bank located on a side of the third light-emitting cell may have a larger inclination angle than a sidewall of a bank located on a side of the first light-emitting cell. With this structure, it is possible to prevent an uneven film thickness of the organic light-emitting layer from occurring in each of the first, second and third light-emitting cells.

In the above-described organic light-emitting panel, the sidewall of the bank located on the side of the first light-emitting cell among the two inner sidewalls facing each other in the two adjacent banks defining the second light-emitting cell, and the two inner sidewalls facing each other in the two adjacent banks defining the first light-emitting cell, may have equal inclination angles. With this structure, it is possible to prevent an uneven film thickness of the organic light-emitting layer from occurring in each of the first, second and third light-emitting cells.

In the above-described organic light-emitting panel, the sidewall of the bank located on the side of the first light-emitting cell among the two inner sidewalls facing each other in the two adjacent banks defining the second light-emitting cell, and the two inner sidewalls facing each other in the two adjacent banks defining the third light-emitting cell, may have equal inclination angles. With this structure, it is possible to prevent an uneven film thickness of the organic light-emitting layer from occurring in each of the first, second and third light-emitting cells.

In the organic light-emitting panel having the above structure, the inclination angles of the sidewalls of the banks can be set to the following ranges:

(a1) among the two inner sidewalls facing each other in the two adjacent banks defining the second light-emitting cell, the sidewall of the bank located on the side of the third light-emitting cell has an inclination angle of at least 35 degrees and at most 45 degrees, (a2) among the two inner sidewalls facing each other in the two adjacent banks defining the second light-emitting cell, the sidewall of the bank located on the side of the first light-emitting cell has an inclination angle of at least 25 degrees and at most 35 degrees, (a3) each of the two inner sidewalls facing each other in the two adjacent banks defining the first light-emitting cell has an inclination angle of at least 25 degrees and at most 35 degrees, and (a4) each of the two inner sidewalls facing each other in the two adjacent banks defining the third light-emitting cell has an inclination angle of at least 25 degrees and at most 35 degrees.

In the above-described organic light-emitting panel, the plurality of light-emitting cells provided in each pixel may include a first light-emitting cell located at an end of the alignment, a second light-emitting cell located at a central portion of the alignment, and a third light-emitting cell located at another end of the alignment, each organic light-emitting layer being formed by applying, for each pixel, three types of ink, which correspond one-to-one to the different colors of light, respectively to the three light-emitting cells in an order of the first light-emitting cell, the second light-emitting cell and the third light-emitting cell, a non-light-emitting cell is provided between each pair of adjacent pixels, a bank is provided between each pair of a pixel and a non-light-emitting cell that are adjacent to each other, the bank separating the pixel from the non-light-emitting cell, and in each pixel, two inner sidewalls, which face each other in two adjacent banks defining the first light-emitting cell, have equal inclination angles, two inner sidewalls, which face each other in two adjacent banks defining the second light-emitting cell, have different inclination angles, and two inner sidewalls, which face each other in two adjacent banks defining the third light-emitting cell, have different inclination angles.

The above structure exerts an effect on the structure where a non-light-emitting cell is provided between each pair of adjacent pixels and ink is applied in the order of the first light-emitting cell, the second light-emitting cell and the third light-emitting cell in each pixel. That is to say, in the above structure, two inner sidewalls, which face each other in two adjacent banks defining the first light-emitting cell to which ink is applied in the first round, have equal inclination angles, two inner sidewalls, which face each other in two adjacent banks defining the second light-emitting cell to which ink is applied in the second round, have different inclination angles, and two inner sidewalls, which face each other in two adjacent banks defining the third light-emitting cell to which ink is applied in the third round, have different inclination angles. With this structure, even in the case where different ink vapor concentrations occur because ink is applied to the light-emitting cells in sequence at different timings, it is possible to effectively prevent an uneven film thickness from occurring in the organic light-emitting layer formed in each of the first, second and third light-emitting cells by adjusting the relative pinning locations of the ink in the sidewalls of the banks.

In the above-described organic light-emitting panel, among the two inner sidewalls facing each other in the two adjacent banks defining the second light-emitting cell, the sidewall of the bank located on the side of the third light-emitting cell may have a larger inclination angle than the sidewall of the bank located on the side of the first light-emitting cell, and among the two inner sidewalls facing each other in the two adjacent banks defining the third light-emitting cell, the sidewall of the bank located on the side of the non-light-emitting cell has a larger inclination angle than the sidewall of the bank located on the side of the second light-emitting cell. With this structure, it is possible to prevent an uneven film thickness of the organic light-emitting layer from occurring in each of the first, second and third light-emitting cells.

In the above-described organic light-emitting panel, the sidewall of the bank located on the side of the third light-emitting cell among the two inner sidewalls facing each other in the two adjacent banks defining the second light-emitting cell, and the sidewall of the bank located on the side of the non-light-emitting cell among the inner sidewalls facing each other in the two adjacent banks defining the third light-emitting cell, may have equal inclination angles. With this structure, it is possible to prevent an uneven film thickness of the organic light-emitting layer from occurring in each of the first, second and third light-emitting cells.

In the above-described organic light-emitting panel, the sidewall of the bank located on the side of the first light-emitting cell among the two inner sidewalls facing each other in the two adjacent banks defining the second light-emitting cell, and the two inner sidewalls facing each other in the two adjacent banks defining the first light-emitting cell, may have equal inclination angles. With this structure, it is possible to prevent an uneven film thickness of the organic light-emitting layer from occurring in each of the first, second and third light-emitting cells.

In the above-described organic light-emitting panel, the sidewall of the bank located on the side of the second light-emitting cell among the two inner sidewalls facing each other in the two adjacent banks defining the third light-emitting cell, and the two inner sidewalls facing each other in the two adjacent banks defining the first light-emitting cell, may have equal inclination angles.

In the organic light-emitting panel having the above structure, the inclination angles of the sidewalls of the banks can be set to the following ranges:

(b1) among the two inner sidewalls facing each other in the two adjacent banks defining the second light-emitting cell, the sidewall of the bank located on the side of the third light-emitting cell has an inclination angle of at least 35 degrees and at most 45 degrees, (b2) among the two inner sidewalls facing each other in the two adjacent banks defining the third light-emitting cell, the sidewall of the bank located on the side of the non-light-emitting cell has an inclination angle of at least 35 degrees and at most 45 degrees, (b3) among the two inner sidewalls facing each other in the two adjacent banks defining the second light-emitting cell, the sidewall of the bank located on the side of the first light-emitting cell has an inclination angle of at least 25 degrees and at most 35 degrees, (b4) among the two inner sidewalls facing each other in the two adjacent banks defining the third light-emitting cell, the sidewall of the bank located on the side of the second light-emitting cell has an inclination angle of at least 25 degrees and at most 35 degrees, and (b5) each of the two inner sidewalls facing each other in the two adjacent banks defining the first light-emitting cell has an inclination angle of at least 25 degrees and at most 35 degrees.

In the above-described organic light-emitting panel, the plurality of light-emitting cells provided in each pixel may include a first light-emitting cell located at an end of the alignment, a second light-emitting cell located at a central portion of the alignment, and a third light-emitting cell located at another end of the alignment, each organic light-emitting layer being formed by applying, for each pixel, three types of ink, which correspond one-to-one to the different colors of light, respectively to the three light-emitting cells at the same time, a non-light-emitting cell is provided between each pair of adjacent pixels, a bank is provided between each pair of a pixel and a non-light-emitting cell that are adjacent to each other, the bank separating the pixel from the non-light-emitting cell, and in each pixel, two inner sidewalls, which face each other in two adjacent banks defining the first light-emitting cell, have different inclination angles, two inner sidewalls, which face each other in two adjacent banks defining the second light-emitting cell, have equal inclination angles, and two inner sidewalls, which face each other in two adjacent banks defining the third light-emitting cell, have different inclination angles.

The above structure exerts an effect on the structure where a non-light-emitting cell is provided between each pair of adjacent pixels and ink is applied at the same time to the first light-emitting cell, the second light-emitting cell and the third light-emitting cell in each pixel. That is to say, since the ink is applied at the same time and a non-light-emitting cell is provided between each pair of adjacent pixels, two regions located on both sides of the second light-emitting cell (located at the central portion of the alignment) have equal ink vapor concentrations and two regions located on both sides of each of the first and third light-emitting cells have different ink vapor concentrations, when ink is applied to the light-emitting cells. Based on this state of ink vapor concentration distribution, in the above structure, two inner sidewalls, which face each other in two adjacent banks defining the first light-emitting cell, have different inclination angles, two inner sidewalls, which face each other in two adjacent banks defining the second light-emitting cell, have equal inclination angles, and two inner sidewalls, which face each other in two adjacent banks defining the third light-emitting cell, have different inclination angles. With this structure, even in the case where different ink vapor concentrations occur when ink is applied, it is possible to effectively prevent an uneven film thickness from occurring in the organic light-emitting layer formed in each of the first, second and third light-emitting cells by adjusting the relative pinning locations of the ink in the sidewalls of the banks.

In the above-described organic light-emitting panel, among the two inner sidewalls facing each other in the two adjacent banks defining the first light-emitting cell, the sidewall of the bank located on the side of the non-light-emitting cell may have a larger inclination angle than the sidewall of the bank located on the side of the second light-emitting cell, and among the two inner sidewalls facing each other in the two adjacent banks defining the third light-emitting cell, the sidewall of the bank located on the side of the non-light-emitting cell has a larger inclination angle than the sidewall of the bank located on the side of the second light-emitting cell. With this structure, it is possible to prevent an uneven film thickness of the organic light-emitting layer from occurring in each of the first, second and third light-emitting cells.

In the above-described organic light-emitting panel, the sidewall of the bank located on the side of the non-light-emitting cell among the two inner sidewalls facing each other in the two adjacent banks defining the first light-emitting cell, and the sidewall of the bank located on the side of the non-light-emitting cell among the inner sidewalls facing each other in the two adjacent banks defining the third light-emitting cell, may have equal inclination angles. With this structure, it is possible to prevent an uneven film thickness of the organic light-emitting layer from occurring in each of the first, second and third light-emitting cells.

In the above-described organic light-emitting panel, the sidewall of the bank located on the side of the second light-emitting cell among the two inner sidewalls facing each other in the two adjacent banks defining the first light-emitting cell, and the two inner sidewalls facing each other in the two adjacent banks defining the second light-emitting cell, may have equal inclination angles. With this structure, it is possible to prevent an uneven film thickness of the organic light-emitting layer from occurring in each of the first, second and third light-emitting cells.

In the above-described organic light-emitting panel, the sidewall of the bank located on the side of the second light-emitting cell among the two inner sidewalls facing each other in the two adjacent banks defining the third light-emitting cell, and the two inner sidewalls facing each other in the two adjacent banks defining the second light-emitting cell, may have equal inclination angles. With this structure, it is possible to prevent an uneven film thickness of the organic light-emitting layer from occurring in each of the first, second and third light-emitting cells.

In the organic light-emitting panel having the above structure, the inclination angles of the sidewalls of the banks can be set to the following ranges:

(c1) among the two inner sidewalls facing each other in the two adjacent banks defining the first light-emitting cell, the sidewall of the bank located on the side of the non-light-emitting cell has an inclination angle of at least 35 degrees and at most 45 degrees, (c2) among the two inner sidewalls facing each other in the two adjacent banks defining the third light-emitting cell, the sidewall of the bank located on the side of the non-light-emitting cell has an inclination angle of at least 35 degrees and at most 45 degrees, (c3) among the two inner sidewalls facing each other in the two adjacent banks defining the first light-emitting cell, the sidewall of the bank located on the side of the second light-emitting cell has an inclination angle of at least 25 degrees and at most 35 degrees, (c4) among the two inner sidewalls facing each other in the two adjacent banks defining the third light-emitting cell, the sidewall of the bank located on the side of the second light-emitting cell has an inclination angle of at least 25 degrees and at most 35 degrees, and (c5) each of the two inner sidewalls facing each other in the two adjacent banks defining the second light-emitting cell has an inclination angle of at least 25 degrees and at most 35 degrees.

In the above-described organic light-emitting panel, each inclination angle may be an angle formed by a side wall of a bank and an upper surface of the underlying layer on which the bank is provided.

In the above-described organic light-emitting panel, the underlying layer may include a TFT layer formed below the first layer, and in the pixel that is structured such that the two inner sidewalls facing each other in the two adjacent banks defining the predetermined light-emitting cell have different inclination angles, the first electrode and the TFT layer may be electrically connected with each other.

An organic display device according to another aspect of the present invention includes any one of the above organic light-emitting panels according to an aspect of the present invention. Therefore, the organic display device according to another aspect of the present invention, as described above, can prevent the organic light-emitting layer in the organic light-emitting panel from becoming uneven in film thickness and provide excellent light-emitting characteristics.

A manufacturing method of an organic light-emitting panel according to a further aspect of the present invention is a manufacturing method of an organic light-emitting panel including an array of a plurality of pixels and the manufacturing method comprises the following steps:

(first step) forming, on a substrate, an underlying layer including a plurality of first electrodes;

(second step) layering a photoresist material on the underlying layer;

(third step) forming, for each pixel, a plurality of openings corresponding to a plurality of light-emitting cells by performing an exposure with a mask laid on the layered photoresist material to form a pattern, and forming a plurality of banks to define each light-emitting cell by separating the light-emitting cells one from another;

(fourth step) forming a plurality of organic light-emitting layers by dripping ink that includes organic light-emitting materials into the plurality of openings corresponding to the plurality of light-emitting cells, and drying the ink; and (fifth step) forming a second electrode above each organic light-emitting layer.

In the manufacturing method of an organic light-emitting panel according to a further aspect of the present invention, in the third step, at least one pixel among the plurality of pixels is formed such that two inner sidewalls, which face each other in two adjacent banks defining a predetermined light-emitting cell among the plurality of light-emitting cells, have different inclination angles.

With the above manufacturing method of the organic light-emitting panel where two inner sidewalls, which face each other in two adjacent banks defining the predetermined light-emitting cell among the plurality of light-emitting cells, have different inclination angles, it is possible to adjust the pinning locations of the ink dripped during the manufacturing. To be more specific, the larger the inclination angle of a sidewall of a bank is, the higher the pinning location is; and the smaller the inclination angle of a sidewall of a bank is, the lower the pinning location is.

In the above manufacturing method of an organic light-emitting panel according to a further aspect of the present invention, it is possible to prevent the organic light-emitting layer in each light-emitting cell from becoming uneven in film thickness, based on the relationship that the film thickness of the organic light-emitting layer and the inclination angle of the bank sidewall have a reverse relationship after the ink is dried. It is thus possible to manufacture an organic light-emitting panel with excellent light-emitting characteristics.

In the above manufacturing method of an organic light-emitting panel according to a further aspect of the present invention, in the third step, the at least one pixel may be formed such that two inner sidewalls, which face each other in two adjacent banks defining a light-emitting cell other than the predetermined light-emitting cell, have equal inclination angles.

When the above structure is adopted, two inner sidewalls, which face each other in two adjacent banks defining the predetermined light-emitting cell, are formed to have different inclination angles. It is thus possible to form the organic light-emitting layer having an even film thickness in each light-emitting cell, and manufacture the organic light-emitting panel having excellent light-emitting characteristics, as described above. In addition, with the above-described structure where, in each of one or more light-emitting cells other than the predetermined light-emitting cell in the pixel, two inner sidewalls facing each other have equal inclination angles, it is possible to prevent the organic light-emitting layer from becoming uneven in film thickness and provide excellent light-emitting characteristics. This makes it possible to manufacture an organic light-emitting panel having excellent light-emitting characteristics in all pixels.

Note that the term "equal" above does not mean exact mathematical equivalence, but rather takes factors such as dimensional error during manufacturing of the display device into account. Specifically, the term "equal" refers to making the inclination angles equal within the range permitted in practice by the difference in luminous efficiency (uneven luminance) between the light-emitting cells in the central region and peripheral region of the panel.

In the above manufacturing method of an organic light-emitting panel according to a further aspect of the present invention, in the third step, when the exposure of the photoresist material is performed, the two inner sidewalls facing each other in the two adjacent banks defining the predetermined light-emitting cell may be formed to have different inclination angles, by causing portions of the photoresist material corresponding to the sidewalls of the banks defining the predetermined light-emitting cell to be exposed to different amounts of light. With the above structure where the two inner sidewalls facing each other in the two adjacent banks defining the predetermined light-emitting cell are formed to have different inclination angles, by causing portions of the photoresist material corresponding to the sidewalls of the banks defining the predetermined light-emitting cell to be exposed to different amounts of light, it is possible to form the organic light-emitting layer having an even film thickness in each light-emitting cell, by adjusting the pinning location. This makes it possible to manufacture an organic light-emitting panel having excellent light-emitting characteristics.

In the above manufacturing method of an organic light-emitting panel according to a further aspect of the present invention, in the third step, when the exposure of the photoresist material is performed, the two inner sidewalls facing each other in the two adjacent banks defining the predetermined light-emitting cell may be formed to have different inclination angles, by using masks that are different in light transmissivity at portions of the photoresist material corresponding to the sidewalls of the banks defining the predetermined light-emitting cell. With the above structure where the two inner sidewalls facing each other in the two adjacent banks defining the predetermined light-emitting cell are formed to have different inclination angles, by causing portions of the photoresist material corresponding to the sidewalls of the banks defining the predetermined light-emitting cell to be exposed to different amounts of light, it is also possible to form the organic light-emitting layer having an even film thickness in each light-emitting cell, by adjusting the pinning location. This makes it possible to manufacture an organic light-emitting panel having excellent light-emitting characteristics.

In the above manufacturing method of an organic light-emitting panel according to a further aspect of the present invention, in the third step, after the photoresist material is exposed and developed, the two inner sidewalls facing each other in the two adjacent banks defining the predetermined light-emitting cell may be formed to have different inclination angles, by additionally performing an exposure process onto a portion of the photoresist material corresponding to one of the two inner sidewalls facing each other in the two adjacent banks defining the predetermined light-emitting cell. The organic display device obtained in this way produces the same advantageous effect as the organic light-emitting panel manufactured by the manufacturing method of the present invention. With the above structure where the two inner sidewalls facing each other in the two adjacent banks defining the predetermined light-emitting cell are formed to have different inclination angles, by causing portions of the photoresist material corresponding to the sidewalls of the banks defining the predetermined light-emitting cell to be exposed to different amounts of light, it is also possible to form the organic light-emitting layer having an even film thickness in each light-emitting cell, by adjusting the pinning location. This makes it possible to manufacture an organic light-emitting panel having excellent light-emitting characteristics.

An organic display device according to a still further aspect of the present invention includes an organic light-emitting panel manufactured by any one of the above-described manufacturing methods of the present invention. The organic display device including the organic light-emitting panel manufactured by the above manufacturing method, as described above, can prevent the organic light-emitting layer in the organic light-emitting panel from becoming uneven in film thickness and provide excellent light-emitting characteristics.

[Embodiment]

The following describes an example of an embodiment of the present invention with reference to the drawings.

Note that the following Embodiment is simply an example to clearly illustrate a structure of the present invention and the acts and effects thereof. The present invention is in no way limited to the following Embodiment except in its essential characteristic elements.

(Process by which the Embodiment According to the Present Invention was Achieved)

As a result of intense study, the inventor of the present invention discovered the following with regard to the organic light-emitting panel recited in the Background Art and the organic display device provided with the organic light-emitting panel.

Figure 25A:
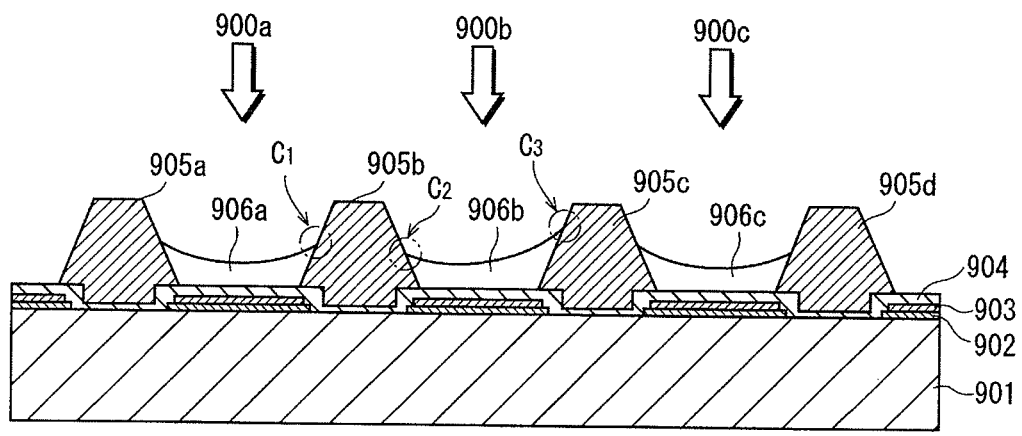
FIGS. 25A and 25B are schematic cross-sectional views showing how the film thickness distribution of the organic light-emitting layer is uneven in a series of sub-pixels of the display panel.

Typically, as shown in FIG. 25A, an anode 902 and an electrode coating layer 903 covering the anode 902 are formed on a substrate 901, for each of sub-pixels 900a, 900b, and 900c. A hole injection layer 904 is then formed to cover the entire surface of the electrode coating layer 903 and the substrate 901, and on the hole injection layer 904, organic light-emitting layers 906a, 906b, and 906c of different colors are formed one-to-one in sub-pixels 900a, 900b, and 900c. The organic light-emitting layers 906a, 906b, and 906c are separated from each other by banks 905a to 905d formed to stand on the hole injection layer 904.

As shown in FIG. 25A, in an organic light-emitting panel of a conventional technology, an uneven film thickness is observed in the organic light-emitting layer 906b of the sub-pixel 900b that is located in a central region of the array. Specifically, the following phenomenon occurs. That is to say, the surface level of the organic light-emitting layer 906b is higher at location $C_3$ in the bank 905c than at location $C_2$ in the bank 905b. Also, the surface level of the organic light-emitting layer 906b is higher than the surface level of the organic light-emitting layer 906a at location $C_1$ in the bank 905b.

Figure 25B:
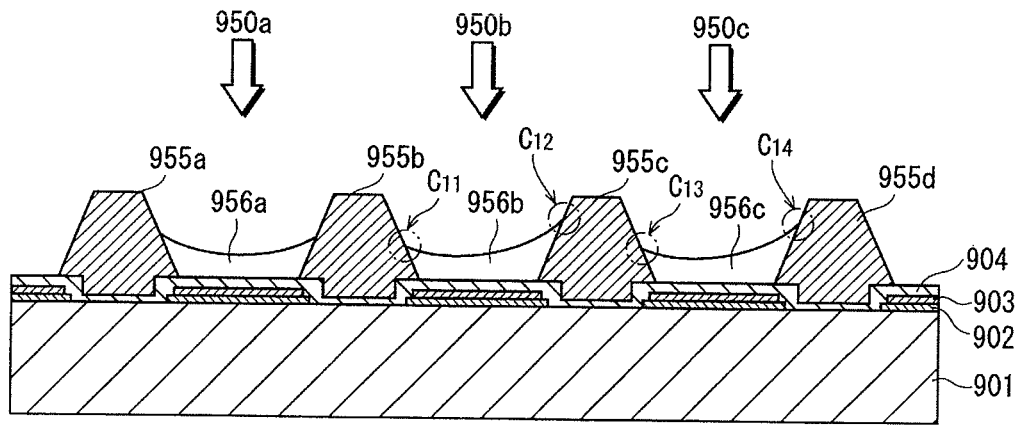

Also, as another example, as shown in FIG. 25B, a phenomenon occurs in which the surface levels of the organic light-emitting layers 956b and 956c in the sub-pixels 950b and 950c at locations $C_{12}$ and $C_{14}$ in the banks 955c and 955d are higher than the surface levels of the organic light-emitting layers 956b and 956c at locations $C_{11}$ and $C_{13}$ in the banks 955b and 955c, respectively. Note that, as shown in FIG. 25B, the surface levels of the organic light-emitting layer 956a in the sub-pixel 950a at respective locations in the bank 955a and the bank 955b are approximately the same, and a large amount of unevenness in film thickness is not observed.

Figure 26A:
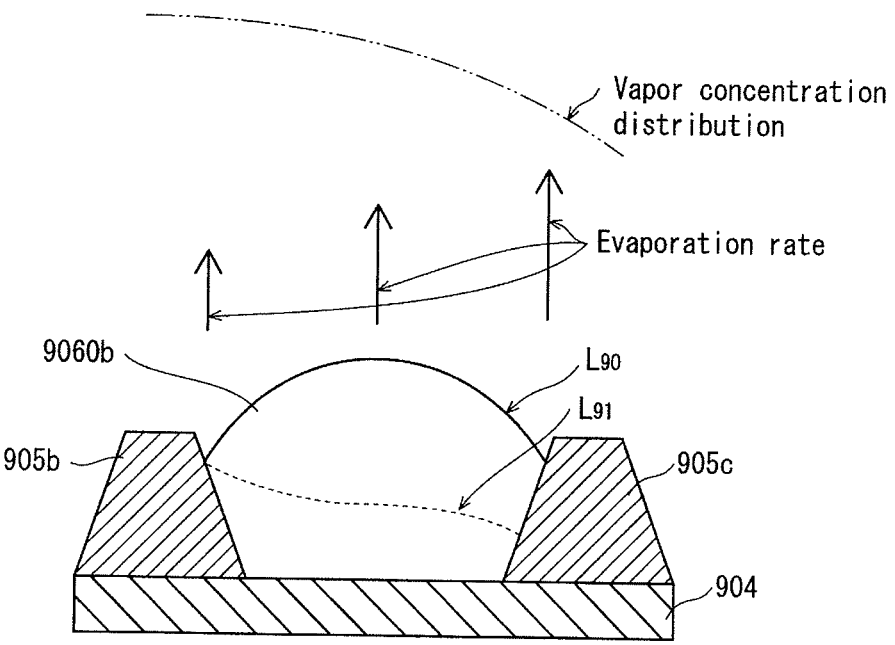
FIGS. 26A-26C are schematic cross-sectional views showing the vapor concentration distribution during formation of the organic light-emitting layer, and unevenness of film shape in the ink drying process.

After repeated examination of the above phenomenon, the inventor determined that reduction in uniformity of film thickness in the organic light-emitting layer causes a non-uniform vapor concentration distribution during ink drying, as described below. That is to say, as shown in FIG. 26A, suppose a state in which ink 9060c for forming the organic light-emitting layer has been applied in an area between the bank 905b and the bank 905c, and the right-hand side of FIG. 26A is lower than the left-hand side in vapor concentration distribution as indicated by the two-dot chain line. In this case, the film thickness in the organic light-emitting layer becomes uneven for the following reasons.

As shown in FIG. 26A, a surface profile $L_{90}$ of ink 9060b has been swollen up in the central region of the sub-pixel immediately after the ink 9060b is dripped. When drying the ink, due to the non-uniform vapor concentration distribution as mentioned above, the evaporation rate varies in reverse proportion to the vapor concentration, and therefore it can be theoretically considered that the ink changes to have a surface profile $L_{91}$.

Figure 26B:
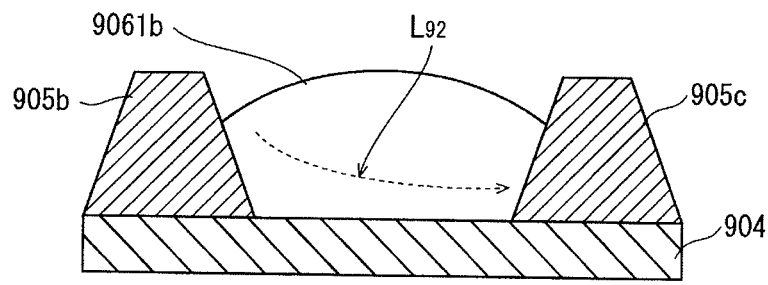
Figure 26C:
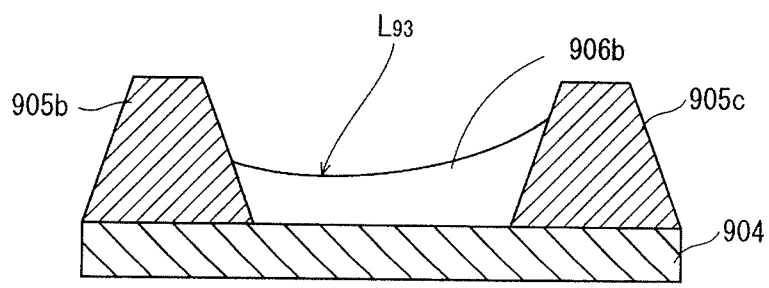

However, as shown in FIG. 26B, solvent in the ink 9061b flows during drying as shown by the dotted-line arrow $L_{92}$. This is because solvent flows to compensate for solvent that has evaporated (i.e. flows to minimize surface free energy), and along with the flow of the solvent, the solute (organic light-emitting material) also flows. Therefore, as shown in FIG. 26C, if the vapor concentration distribution is not uniform, the organic light-emitting layer 906b is formed to have a surface profile $L_{93}$ in which the closer to the right-hand side the layer is, the higher the layer is.

The inventor therefore deduced that, in an organic light-emitting panel, uniformity of film thickness of the organic light-emitting layer decreases due to non-uniformity of vapor concentration distribution during ink drying.

The inventor also discovered technology to vary, within the panel, the pinning location of ink on a bank side wall by varying the inclination angle of the bank side wall, which improves uniformity of film thickness in the organic light-emitting layer.

[Embodiment 1]

1. Configuration of Display Device 1

The overall structure of the display device 1 according to the present Embodiment is described with reference to FIG. 1.

As shown in FIG. 1, the display device (organic display device) 1 includes a display panel unit 10 and a drive control unit 20 connected to the display panel unit 10. The display panel unit 10 is an organic light-emitting panel that uses the phenomenon of electroluminescence occurring in organic material and is composed of a plurality of pixels arrayed two-dimensionally in the X-Y plane direction.

The drive control unit 20 is composed of four drive circuits 21-24 and a control circuit 25.

Note that in an actual display device 1, the placement of the drive control unit 20 with respect to the display panel unit 10 is not limited in this way.

2. Structure of Display Panel 10

Figure 2:
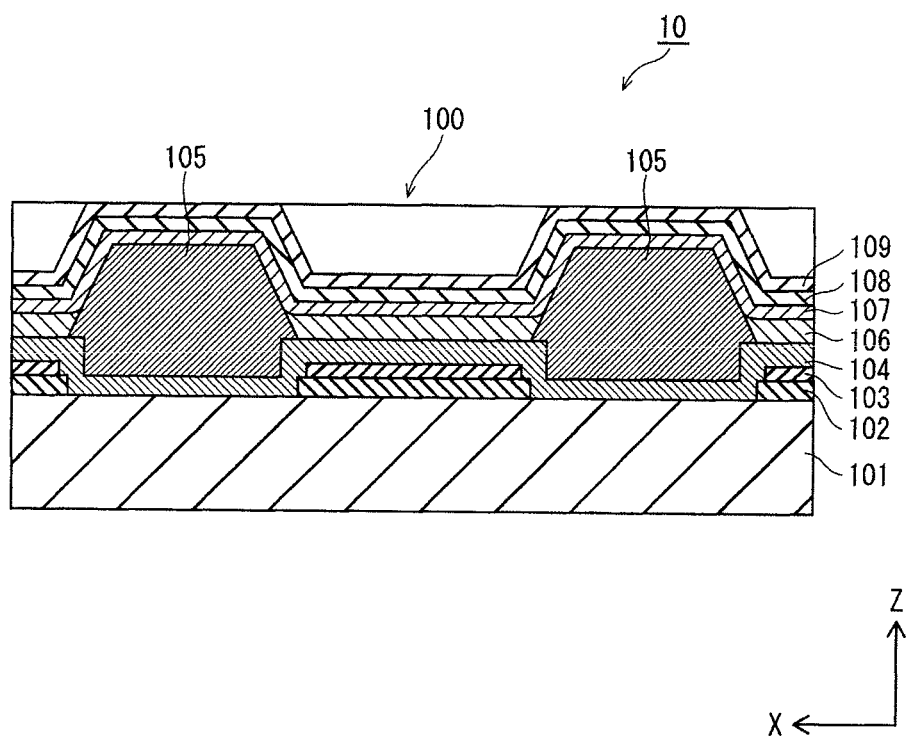
FIG. 2 is a schematic cross-sectional view showing a sub-pixel 100 included in a display panel 10.

The structure of the display panel 10 is described with reference to FIG. 2. Note that, as an example, the display panel 10 in the present Embodiment is a top emission type organic light-emitting panel including a plurality of pixels arranged in a matrix, each pixel including sub-pixels that are each provided with an organic light-emitting layer having a luminescent color of either red (R), green (G), or blue (B). FIG. 2 depicts one sub-pixel 100 in a pixel.

As shown in FIG. 2, in the display panel 10, anodes 102 are formed above a TFT substrate (hereinafter simply referred to as a "substrate") 101 in one-to-one correspondence with the sub-pixels 300a, 300b and 300c, and on each of the anodes 102, an electrode coating layer 103 is formed, and a hole injection transporting layer 104 is layered on the electrode coating layers 103.

Above the hole injection transporting layer 104, banks 105, made of insulating material, are provided to stand to separate the sub-pixels 100 from each other. An organic light-emitting layer 106 is formed in the region in each sub-pixel 100 separated by the banks 105, and an electron injection layer 107, cathode 108, and passivation layer 109 are layered above the organic light-emitting layer 106 in this order.

a) Substrate 101

The substrate 101 is made of a base of an insulating material such as alkali-free glass, soda glass, non-fluorescent glass, phosphate glass, borate glass, quartz, acrylic resin, styrenic resin, polycarbonate resin, epoxy resin, polyethylene, polyester, silicone resin, alumina, etc. Although not illustrated, in the substrate 101, a TFT layer, a passivation film, an interlayer insulation film, etc. are laminated.

b) Anode 102

The anode 102 is composed of a single layer or of a laminate of a plurality of layers, either being made of a conductive material, such as aluminum (Al), alloy including Al, silver (Ag), alloy of silver, palladium, and copper (APC), alloy of silver, rubidium, and gold (ARA), alloy of molybdenum and chromium (MoCr), alloy of nickel and chromium (NiCr), etc. Note that in the case of a top emission type panel such as the panel in the Embodiment, it is preferable that the anode 102 be made of a highly reflective material.

c) Electrode Coating Layer 103

The electrode coating layer 103 is made of, for example, indium tin oxide (ITO) and covers at least a part of the top surface the anode 102 in the Z axis direction.

d) Hole Injection Transporting Layer 104

The hole injection transporting layer 104 is a layer formed from an oxide of a metal such as silver (Ag), molybdenum (Mo), chromium (Cr), vanadium (V), tungsten (W), nickel (Ni), or iridium (Ir), or formed from a conductive polymer material, such as PEDOT (a mixture of polythiophene and polystyrene sulfonate). The hole injection transporting layer 104 formed from such a metal oxide, among the above materials, has the function of assisting with generation of holes and injecting and transporting the holes stably into the organic light-emitting layer 106. The hole injection transporting layer 104 has a high work function.

When the hole injection transporting layer 104 is made of an oxide of a transition metal, a plurality of levels can be occupied since there are a plurality of oxidation numbers. This makes hole injection easy and allows for reduction of driving voltage.

e) Banks 105

The banks 105 are made of an organic material such as resin and have insulating properties. Examples of the organic material used to form the banks 105 include acrylic resin, polyimide resin, novolac-type phenolic resin, etc. It is also preferable that the banks 105 have organic solvent resistance.

Furthermore, since the banks 105 are etched and baked when formed, it is preferable that the banks be made of a highly resistant material that will not change in shape or quality during the etching and baking processes. To provide the banks with liquid repellency, the sidewalls can be fluoridated.

Note that as the insulating material used in forming the banks 105, any liquid repellent material with a resistivity of $10^5$ Ω·cm can be used, starting with the above materials. Using a material with a resistivity of less than $10^5$ Ω·cm leads to production of leak current between the anode 102 and the cathode 108, or between adjacent sub-pixels 100, which causes a variety of problems such as increased power consumption.

Furthermore, if a hydrophilic material is used to form the banks 105, the difference in affinity/liquid repellency between the sidewall of the banks 105 and the surface of the hole injection transporting layer 104 becomes small, and it thus becomes difficult to selectively maintain the ink, which includes an organic substance for forming the organic light-emitting layer 106, at the opening of the banks 105.

The structure of the banks 105 need not be a single layer as shown in FIG. 2, but may adopt a multi-layered structure composed of two or more layers. In such a case, the above materials may be combined for each layer, or layers may alternate between non-organic and organic material.

f) Organic Light-Emitting Layer 106

The organic light-emitting layer 106 has a function to emit light when an excitation state is produced by the recombination of holes injected through the anode 102 with electrons injected through the cathode 108. The material used to form the organic light-emitting layer 106 needs to be a light-emitting organic material, a film of which can be formed by wet printing.

More specifically, it is preferable that the organic light-emitting layer 106 be made of a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

g) Electron Injection Layer 107

The electron injection layer 107 has a function to transport electrons injected through the cathode 108 to the organic light-emitting layer 106 and is preferably made of, for example, barium, phthalocyanine, lithium fluoride, or a combination thereof.

h) Cathode 108

The cathode 108 is made of, for example, ITO, indium zinc oxide (IZO), etc. When the display panel 10 is a top-emission type, it is preferable that the cathode 108 be made of a light-transmissive material. It is preferable that the light transmissivity be 80% or greater.

The material used to form the cathode 108 may be, in addition to the above materials, for example, an alkali metal, alkali earth metal, or a laminate structure having, in the following order, a layer that includes a halide of an alkali metal or alkali earth metal and a layer that includes silver. The layer that includes silver may be made of silver alone, or from a silver alloy. Also, in order to increase light extraction efficiency, a highly-transparent refraction index adjustment layer may be provided above the layer that includes silver.

i) Passivation Layer 109

The passivation layer 109 has a function to control the organic light-emitting layer 106 or other layers from being exposed to water or air and is made of, for example, silicon nitride (SiN), silicon oxynitride (SiON) etc. When the display panel 10 is a top-emission type, it is preferable that the passivation layer 109 be made of a light-transmissive material.

3. Structure of Banks 105

Figure 3:
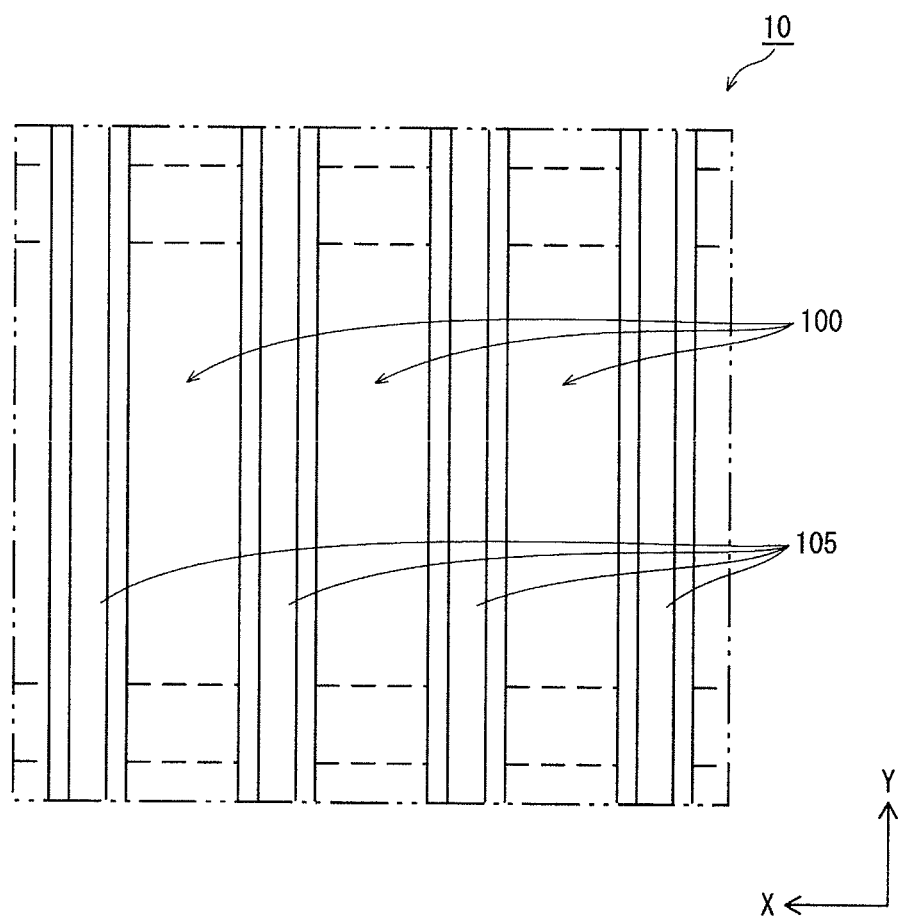
FIG. 3 is a schematic plan view showing a bank 105 in the display panel 10.

As shown in FIG. 3, in the display panel 10 of the present Embodiment, the banks 105 are arranged in lines, as one example. More specifically, the banks 105 each extend along the Y axis and separate the adjacent sub-pixels 100 in the X axis direction. The sub-pixels 100 are formed so that each of the regions separated by the banks 105 in each pixel emits a different color. For example, one pixel is composed of three sub-pixels that emit light of red (R), green (G), and blue (B), respectively.

4. Structure of Banks 105 in Each Region

The structure of the banks 105 in each region is described with reference to FIG. 4. Note that FIG. 4 is a schematic cross-sectional view taken along line A-A' passing through the display panel 10 in FIG. 1, and schematically illustrating some parts thereof.

Figure 4:
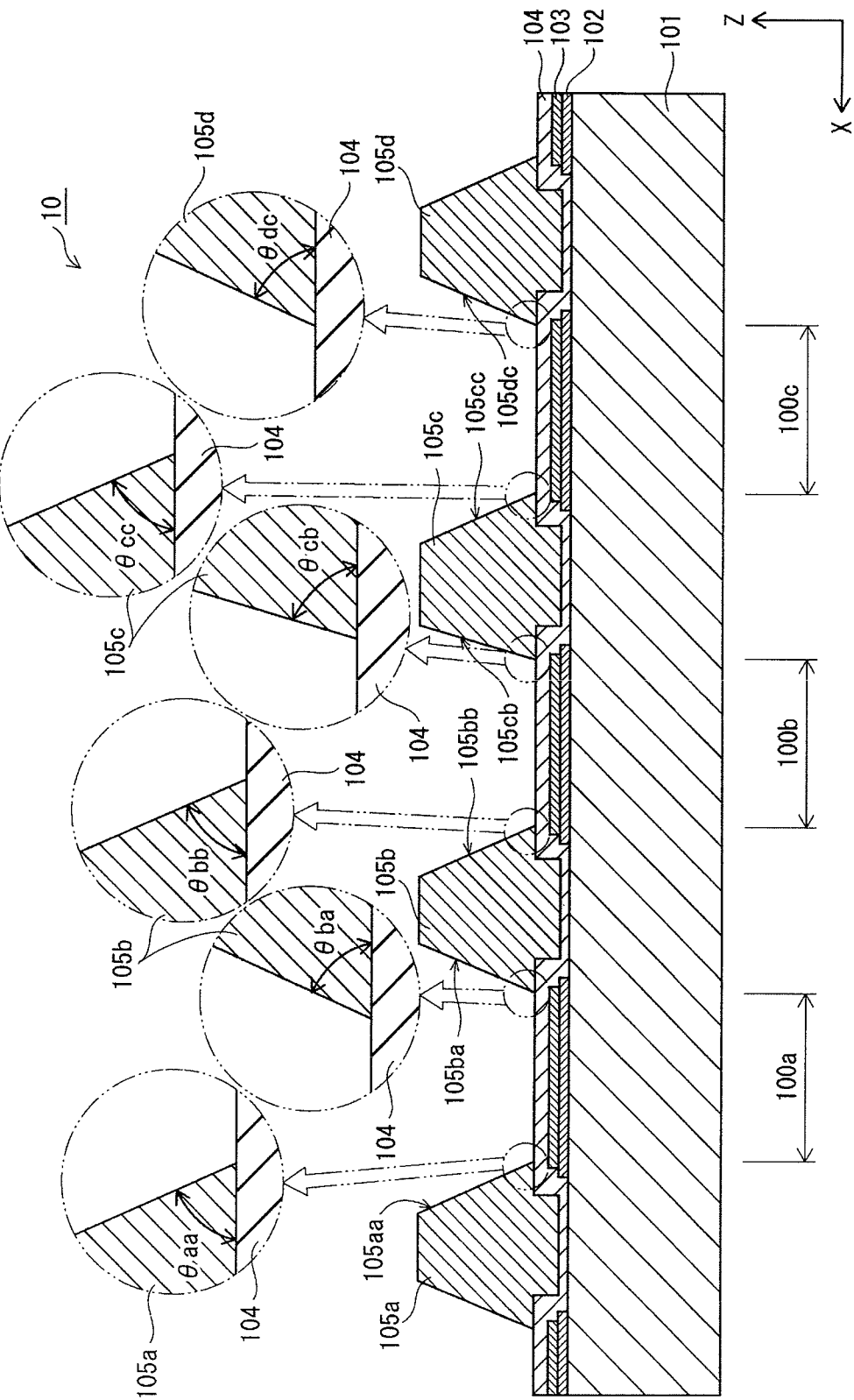
FIG. 4 is a schematic cross-sectional view showing the structure of sub-pixels 100a to 100c included in the display panel 10 and banks 105a to 105d that separate the sub-pixels 100a to 100c from each other.

As shown in FIG. 4, sub-pixels 100a, 100b, and 100c are arranged continuously in this order from left to right along the X axis direction. Note that in the display panel 10 of the present embodiment, the sub-pixels are arranged to be continuously adjacent to each other.

The sub-pixel 100a is defined by banks 105a and 105b; the sub-pixel 100b is defined by banks 105b and 105c; and the sub-pixel 100c is defined by banks 105c and 105d. Sidewalls 105aa, 105ba, 105bb, 105cb, 105cc, and 105dc of the banks 105a, 105b, 105c and 105d respectively form angles θaa, θba, θbb, θcb, θcc, and θdc with the surface of the hole injection transporting layer 104, which is an underlying layer.

In the present Embodiment, the angles θaa, θba, θbb, θcb, θcc, and θdc satisfy the relationships indicated by the following expressions.

$$\theta cb > \theta aa = \theta ba = \theta bb = \theta cc = \theta dc \quad \text{[Expression 1]}$$

Note that in the present Embodiment, it is preferable that the angles θaa, θba, θbb, θcb, θcc, and θdc satisfy the relationships indicated by the above Expression 1 and are set to the following ranges.

$$25° < \theta aa = \theta ba = \theta bb = \theta cc = \theta dc < 35° \quad \text{[Expression 2]}$$

$$35° < \theta cb < 45° \quad \text{[Expression 3]}$$

5. Relationship Between Inclination Angle θ of Sidewall of Banks 105 and Film Thickness of Organic Light-Emitting Layer 106

The relationship between the inclination angles θ of the sidewalls of the banks 105 and the film thickness of the organic light-emitting layer 106 is described with reference to FIGS. 5 and 6. Note that FIG. 5 is a schematic rendering of the structure of a sub-pixel.

Figure 5A:
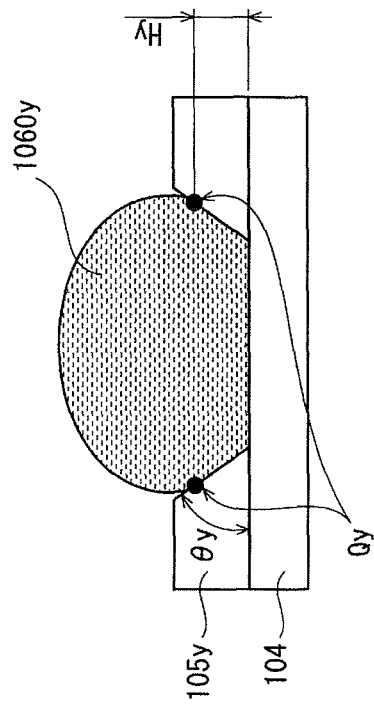
FIG. 5A is a schematic cross-sectional view showing pinning locations when the taper angle of the bank sidewall is small.
Figure 5C:
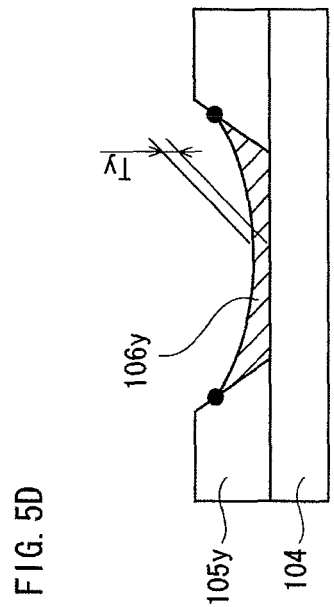
FIG. 5C is a schematic cross-sectional view showing the condition of the organic light-emitting layer after drying when the taper angle of the bank sidewall is small.
Figure 5B:
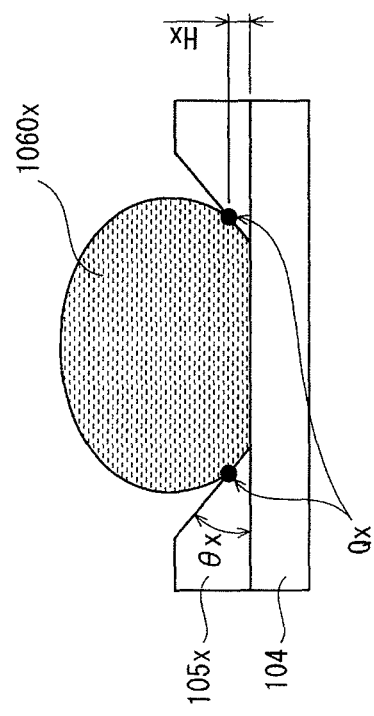
FIG. 5B is a schematic cross-sectional view showing pinning locations when the taper angle of the bank sidewall is large.

As shown in FIG. 5A, the inclination angle of the sidewall of bank 105x (the angle formed between the sidewall and the surface of the hole injection transporting layer 104) is represented by angle θx, and as shown in FIG. 5B, the inclination angle of the sidewall of bank 105y (the angle formed between the sidewall and the surface of the hole injection transporting layer 104) is represented by angle θy. Here, the angles θx and θy satisfy the following relationship.

$$\theta y > \theta x \quad \text{[Expression 4]}$$

When ink 1060x and ink 1060y, which include an organic light-emitting material, are each dripped into the openings defined by the banks 105x and 105y, respectively, the pinning locations Px and Py respectively have heights Hx and Hy that satisfy the following relationship.

$$Hy > Hx \quad \text{[Expression 5]}$$

As shown in FIG. 5C, after drying the ink 106θx, the height Hx of the pinning location Px is relatively low, which causes the organic light-emitting layer 106x to swell at the central portion of the sub-pixel to a film thickness of Tx.

Figure 5D:
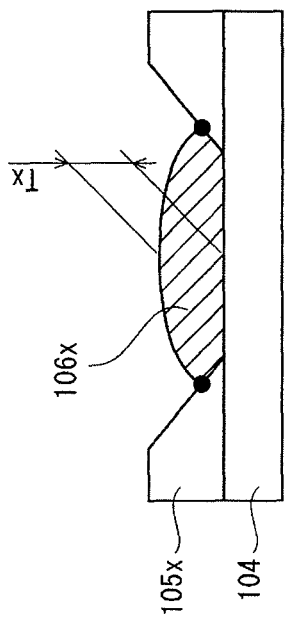
FIG. 5D is a schematic cross-sectional view showing the condition of the organic light-emitting layer after drying when the taper angle of the bank sidewall is large.

On the other hand, as shown in FIG. 5D, after drying the ink 1060y, the height Hy of the pinning location Py is relatively high, which causes the organic light-emitting layer 106y to sag at the central portion of the sub-pixel to a film thickness of Ty.

The thicknesses Tx and Ty satisfy the following relationship.

$$Tx > Ty \quad \text{[Expression 6]}$$

FIG. 6 summarizes the above relationships. As shown in FIG. 6, as the inclination angle (taper angle) θ of the bank 105 grows smaller, the pinning height H lowers, and as a result, the film thickness T of the organic light-emitting layer 106 becomes thicker. Conversely, as the inclination angle (taper angle) θ of the bank 105 grows larger, the pinning height H becomes higher, and as a result, the film thickness T of the organic light-emitting layer 106 becomes thinner.

Figure 7:
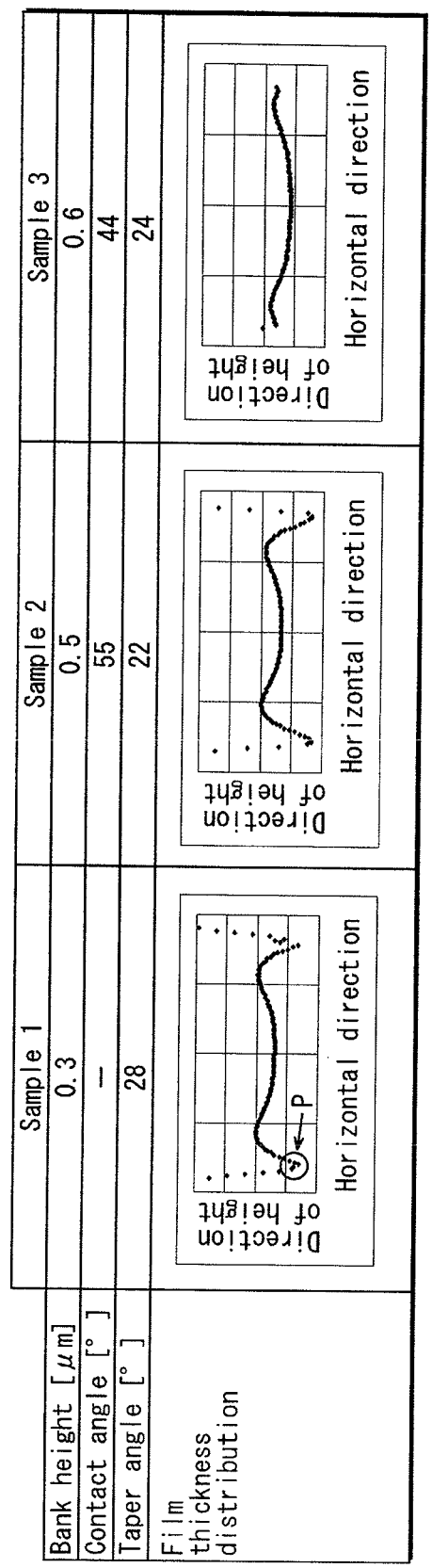
FIG. 7 shows a distribution of film thickness of the organic light-emitting layer in samples 1-3.

Based on the above factors, five samples were created and evaluated. FIGS. 7 and 8 show the results.

As shown in FIGS. 7 and 8, as compared to the distribution of film thickness of sample 2, the pinning location is higher in samples 3 and 4, which have a larger taper angle. Note that in FIGS. 7 and 8, the horizontal axis represents the horizontal direction, and the vertical axis represents the direction of height.

In sample 5, however, in which the bank has a taper angle (inclination angle) of 50°, the film thickness is less uniform than in sample 2.

6. Manufacturing Method of Display Panel 10

The following describes the characteristic processes of the manufacturing method of the display panel 10 according to the present Embodiment with reference to FIGS. 9 and 10. Note that with regard to the manufacturing processes that are omitted in the following description, any of the variety of processes suggested by conventional technologies may be used.

Figure 9A:
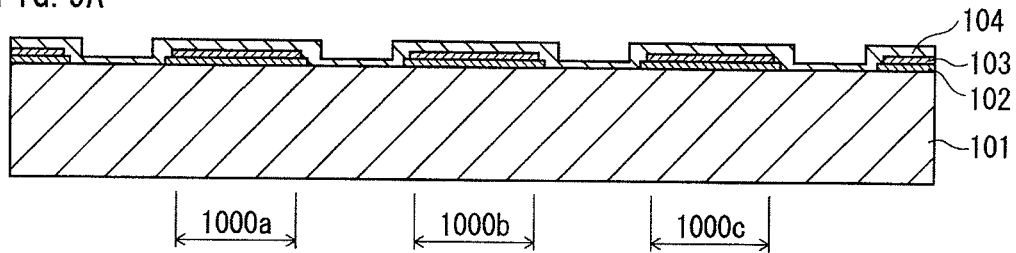
FIGS. 9A-9C are schematic cross-sectional views showing, in order, the main processes in the manufacturing method of the display panel 10.

First, as shown in FIG. 9A, above the substrate 101 in the direction of the Z axis, anodes 102 and electrode coating layers 103 are layered in this order in regions in which sub-pixels 1000a, 1000b, and 1000c are to be formed. Furthermore, A hole injection transporting layer 104 is then layered thereon so as to cover the entire surface. The anodes 102 is formed, for example, by first forming a thin film made of Al or Al alloy or a thin Ag film by the sputtering method or vacuum deposition method and then patterning the thin Ag film by the photolithography method.

The electrode coating layers 103 is formed, for example, by forming a thin ITO film on the surface of the anodes 102 using a method such as the sputtering method and then patterning the thin ITO film by a method such as photolithography. To form the hole injection transporting layer 104, first a metal film is formed on the surface of the substrate 101, including the surface of the electrode coating layer 103, by a method such as the sputtering method. Subsequently, the metal film is oxidized to form the hole injection transporting layer 104.

Figure 9B:
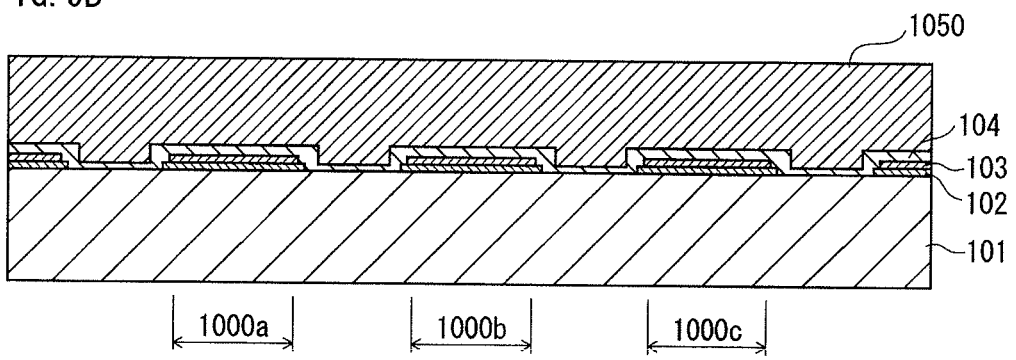

Next, as shown in FIG. 9B, the spin coat method, for example, is used to form a bank material layer 1050 so as to cover the top of the hole injection transporting layer 104. A photoresist material is used to form the bank material layer 1050. Specifically, as described above, an organic material having insulating properties such as acrylic resin, polyimide resin, novolac-type phenolic resin, etc. can be used.

Figure 9C:
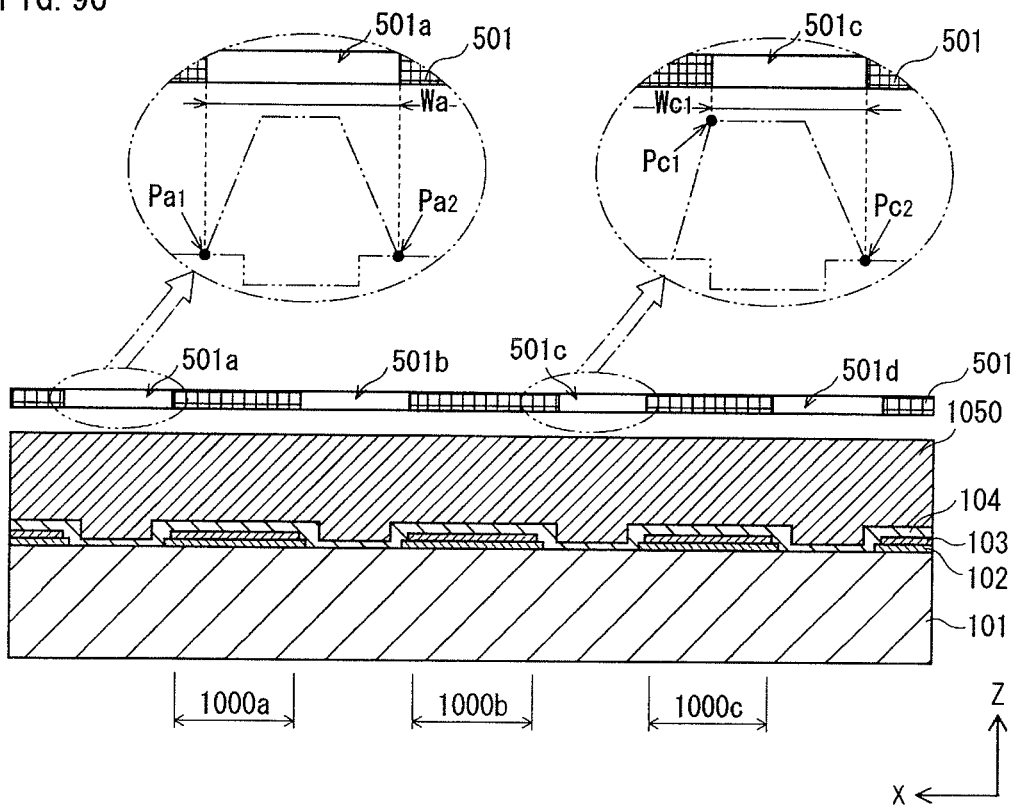

Subsequently, as shown in FIG. 9C, a mask 501 is placed above the bank material layer 1050, the mask 501 having openings 501a, 501b, 501c, and 501d at the locations for forming the banks. In this state, exposure is performed via the openings 501a, 501b, 501c, and 501d of the mask 501.

Note that, as shown in FIG. 9C, in the mask 501, a width Wa of the opening 501a located on the left-hand side of a region 1000a in which a sub-pixel is to be formed (hereinafter, such a region is referred to as "planned sub-pixel formation region"), is defined by points Pa1 and Pa2 positioned at the foots of the sidewalls 105aa, . . . of the bank 105a that is to be formed (see FIG. 4).

On the other hand, a width Wc1 of the opening 501c located between the planned sub-pixel formation regions 1000b and 1000c is defined by a point Pc1 being at the upper edge of the sidewall 105cb of the bank 105c that is to be formed (see FIG. 4) and a point Pc2 being at the foot of the sidewall 105cc of the bank 105c that is to be formed (see FIG. 4).

Figure 10A:
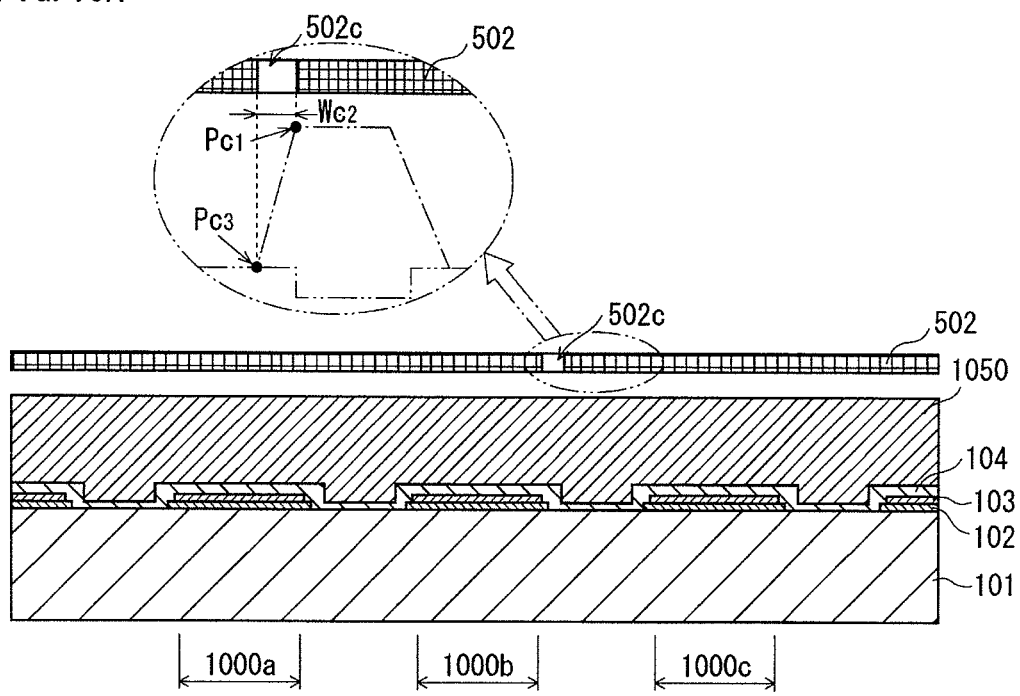
FIGS. 10A-10C are schematic cross-sectional views showing, in order, the main processes in the manufacturing method of the display panel 10.

Next, as shown in FIG. 10A, a mask 502 is placed above the bank material layer 1050, the mask 502 having opening 502c at the location corresponding to the sidewall 105cb of the bank 105c (see FIG. 4). In this state, the second exposure is performed via the opening 502c of the mask 502.

Note that, as shown in FIG. 10A, in the mask 502, a width Wc2 of the opening 502c is defined by points Pc3 and Pc1 being at the foot and the upper edge of the sidewall 105cb of the bank 105c that is to be formed.

Figure 10B:
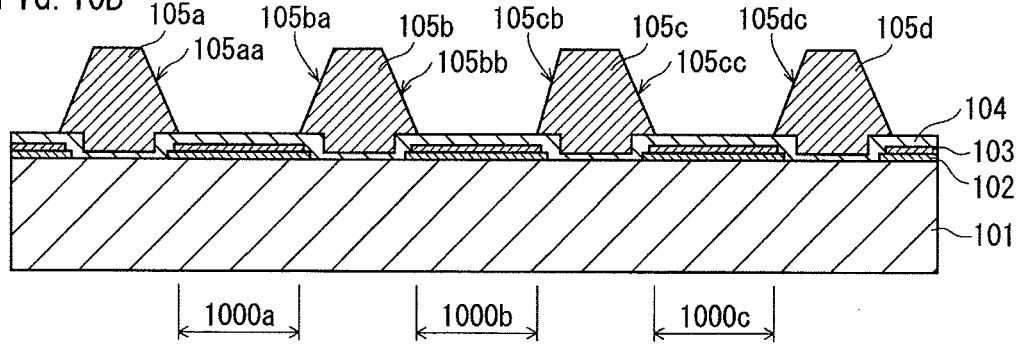

Next, the development and baking are performed to form the banks 105a, 105b, 105c, and 105d as shown in FIG. 10B.

As described above, the sidewall 105cb of the bank 105c on the planned sub-pixel formation region 1000b side is larger than the sidewalls 105aa, 105ba, 105bb, and 105dc of the banks 105a, 105b and 105d and the sidewall 105cc of the bank 105c on the planned sub-pixel formation region 1000c side.

Figure 10C:
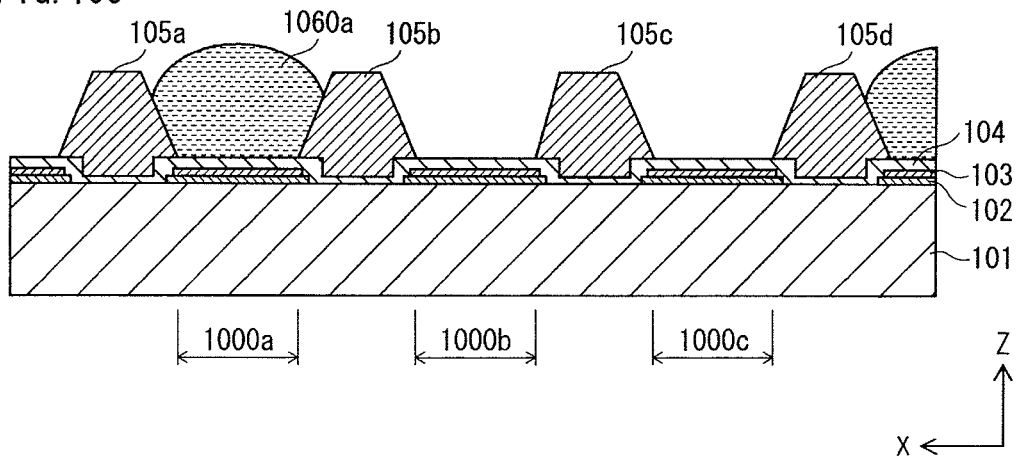

After this, as shown in FIG. 10C, ink 1060a including an organic light-emitting material is applied to an opening (the planned sub-pixel formation region 1000a) defined by the banks 105a and 105b by the inkjet method or the like.

Subsequently, as shown in FIG. 11A, ink 1060b including an organic light-emitting material is applied to an opening (the planned sub-pixel formation region 1000b) defined by the banks 105b and 105c by the inkjet method or the like. Here, since, as described above, the inclination angle of the sidewall 105cb of the bank 105c is set to be larger than the inclination angles of the other sidewalls, the pinning location Qcb of the ink 1060b in the sidewall 105cb of the bank 105c becomes higher in position than the other pinning locations Qaa, Qba, and Qbb.

Subsequently, as shown in FIG. 11B, ink 1060c including an organic light-emitting material is applied to an opening (the planned sub-pixel formation region 1000c) defined by the banks 105c and 105d by the inkjet method or the like. Here, since ink has already been applied to the planned sub-pixel formation region adjacent, on the right-hand side, to the bank 105d, two ends of the applied ink 1060c in the X axis direction have the same ink vapor concentration, and the organic light-emitting layer has even film thickness without adjustment of the inclination angles of the sidewalls of the banks. This is clear from the above.

Note that, although not illustrated, subsequently the ink is dried, and the electron injection layer 107, cathode 108, passivation layer 109, etc, are layered in this order to form the display panel 10.

7. Ink Applying Process and Drying Process

Figure 12A:
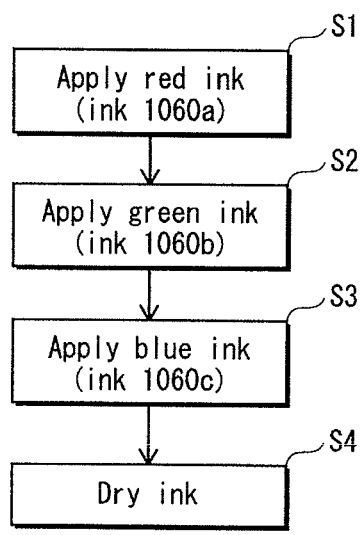
FIG. 12A is a schematic flowchart showing a procedure of applying and drying the inks 1060a-1060c.
Figure 12B:
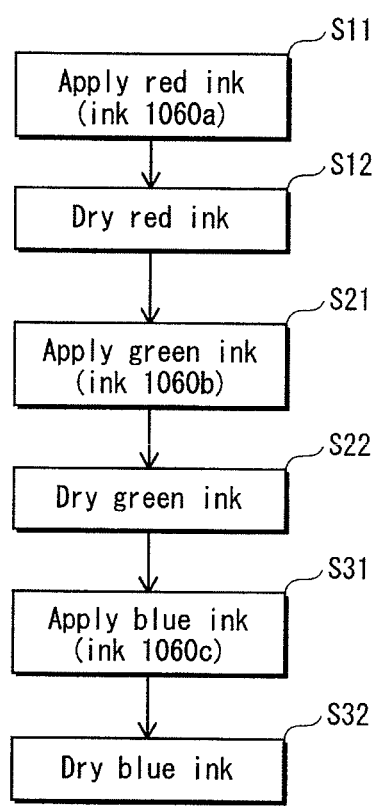
FIG. 12B is a schematic flowchart showing another procedure of applying and drying the inks 1060a-1060c.

The following describes the relationships between the ink applying process and the ink drying process with reference to FIGS. 12A and 12B.

As illustrated in FIG. 12A, in the present embodiment, firstly red ink (the ink 1060a) is applied (step S1), then green ink (the ink 1060b) is applied (step S2), and blue ink (the ink 1060c) is applied (step S3). After this, ink drying process is performed to dry all the applied inks at once (step S4).

As an alternative to the above method, as illustrated in FIG. 12B, the following processes may be performed in sequence in the stated order: applying red ink (the ink 1060a) (step S11) and drying the applied red ink (step S12); applying green ink (the ink 1060b) (step S21) and drying the applied green ink (step S22); and applying blue ink (the ink 1060c) (step S31) and drying the applied blue ink (step S32). In this case, the relationships in inclination angle among the side walls 105aa, 105ba, 105bb, 105cb, 105cc, and 105dc of the banks 105a, 105b, 105c, and 105d may be the same as those described above. This structure also can restrict the film thickness of the formed organic light-emitting layer 106 from becoming uneven.

8. Advantageous Effects

As shown in FIG. 4, in the display panel 10 of the display device 1 according to the present Embodiment, inclination angle θcb of the sidewall 105cb of the bank 105c positioned on the sub-pixel 100c side is set larger than the inclination angles θaa, θba, θbb, θcc, and θdc of other sidewalls 105aa, 105ba, 105bb, 105cc, and 105dc. As a result, as shown in FIG. 11A, when the ink 1060b is applied in the planned sub-pixel formation region 1000b, the pinning location Qcb is higher in position than the other pinning locations Qaa, Qba, and Qbb.

On the other hand, the inclination angles θaa, θba, θbb, θcc, and θdc of the other sidewalls 105aa, 105ba, 105bb, 105cc, and 105dc are equal.

This enables sub-pixels 100a, 100b, and 100c to have a uniform film thickness in the organic light-emitting layer 106 of the display panel 10 after drying, which produces an advantageous effect of having little luminance unevenness.

Note that, by using the manufacturing method of the display device 1 in the present Embodiment, which has been described with reference to FIGS. 9, 10, and 11, the display device 1 having the above advantageous effect can be manufactured.

Also, the term "equal" does not necessarily mean that the targets are completely equal with each other in numerical value, but includes, for example, a measurement error in manufacturing of the display device 1. More specifically, it is suggested that, in the display panel 10, the inclination angles are recognized as being equal as far as the difference in luminous efficiency (luminance unevenness) between sub-pixels 100a, 100b, and 100c, which correspond to the inclination angles, fails in an acceptable range.

[Modification 1]

Figure 13:
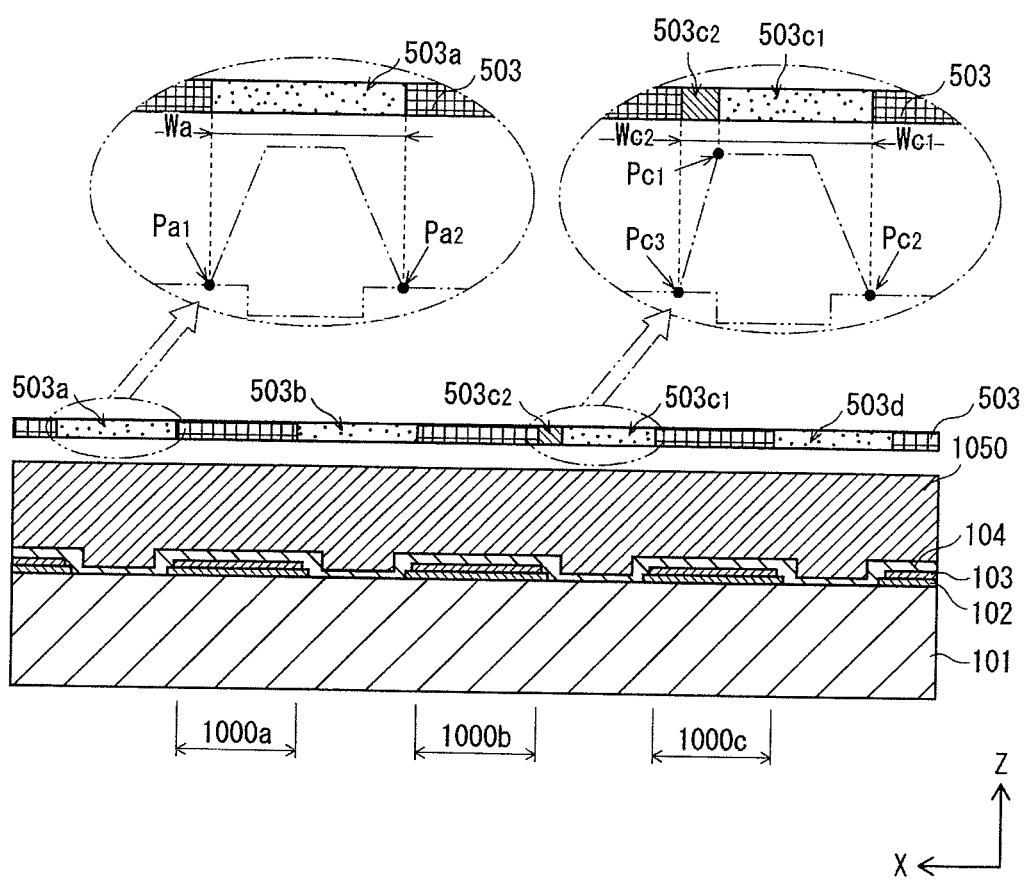
FIG. 13 is a schematic cross-sectional view showing the main processes in the manufacturing method of Modification 1.

Next, with reference to FIG. 13, Modification 1 of the manufacturing method of the display device 1 is described. FIG. 13 illustrates processes corresponding to processes illustrated in FIGS. 9C to 10A.

As shown in FIG. 13, first a bank material layer 1050 is formed to cover the hole injection transporting layer 104, and then a mask 503 is placed above the bank material layer 1050. The mask 503 is provided with light transmissive portions 503a, 503b, 503c1, 503c2, and 503d. The light transmissive portions 503a, 503b, 503c1, 503c2, and 503d are provided at locations corresponding to portions in which the banks 105a, 105b, 105c, and 105d are to be formed.

In the manufacturing method of the display device 1 in Modification 1, width Wa of the light transmissive portion 503a, which corresponds to the left-hand side of the planned sub-pixel formation region 1000a, is defined by points Pa1 and Pa2 at the feet of the sidewalls 105aa, . . . of the bank 105a (see FIG. 4) that is to be formed.

On the other hand, width Wc2 of the light transmissive portion 503c1, which corresponds to a region between the planned sub-pixel formation regions 1000b and 1000c, is defined by points Pc2 and Pc1 that are respectively positioned at the foot and upper edge of the bank 105c to be formed (see FIG. 4). Also, the light transmissive portion 503c2 is defined by points Pc3 and Pc1 that are respectively positioned at the foot and upper edge of the sidewall 105cb of the bank 105c to be formed (see FIG. 4).

The mask 503 is made from a half-tone or the like, and the light transmissive portions 503a, 503b, 503c1, and 503d differ from the light transmissive portion 503c2 in light transmissivity. More specifically, the light transmissive portion 503c2 is larger than the light transmissive portions 503a, 503b, 503c1, and 503d in light transmissivity.

In the state where the mask 503 having the above structure is set in place, the exposure and development, and then baking are performed to form the banks 105a, 105b, 105c, and 105d as shown in FIG. 10B. That is to say, sidewalls having larger inclination angles are formed at locations which are exposed to light via the light transmissive portion 503c2 having a larger light transmissivity than the light transmissive portions 503a, 503b, 503c1, and 503d, in accordance with the relationship indicated by the above-described Expression 1.

Note that subsequent processes are the same as those in the above Embodiment.

The display device 1 can be manufactured by the above manufacturing method as well.

[Modification 2]

Next, with reference to FIGS. 14A to 15B, Modification 2 of the manufacturing method of the display device 1 is described. FIGS. 14A to 15B illustrate processes corresponding to the processes illustrated in FIGS. 9C to 10B.

As shown in FIG. 14A, first a bank material layer 1050 is formed to cover the hole injection transporting layer 104, and then a mask 504 is placed above the bank material layer 1050. The mask 504 has openings 504a, 504b, 504c, and 504d corresponding to the portions at which banks 105 are to be formed.

The openings 504a, 504b, and 504d are formed to have the same width as the opening 501a in the mask 501 used in the manufacturing method of the above Embodiment.

On the other hand, a width Wc3 of the opening 504c located between the planned sub-pixel formation regions 1000b and 1000d in correspondence with the bank 105c that is to be formed (see FIG. 4) is set to be larger than a width that is defined by points Pc3 and Pc2 being at the feet of the bank 105c that is to be formed (see FIG. 4), as indicated by the two-dot chain line in FIG. 14A. More specifically, the width is made larger at the portions where the inclination angles are to be larger.

In the state where the mask 504 is set in place as shown in FIG. 14A, the exposure and development in the first round are performed. After this process is performed, as shown in FIG. 14B, bank material layers 1051a, 1051b, 1051c, and 1051d remain in the locations corresponding to the openings 504a, 504b, 504c, and 504d.

Note that, as shown in FIG. 14B, the inclination angles of the sidewalls in the bank material layers 1051a, 1051b, 1051c, and 1051d are uniform after the first exposure and development are performed. In Modification 2, the baking is not performed at this point in time.

As shown in FIG. 15A, a mask 505 is placed above the bank material layers 1051a, 1051b, 1051c, and 1051d after they are formed. In the mask 505, an opening 505c is provided only at the location where the inclination angle is to be larger (sidewall 105cb of the bank 105c) among the locations in the mask 505 corresponding to the sidewalls of the banks 105a, 105b, 105c, and 105d that are to be formed.

In the state where the mask 505 is set in place, the exposure and development in the second round are performed, and then the baking is performed to form the banks 105a, 105b, 105c, and 105d as shown in FIG. 15B.

Subsequently, the display device 1 can be manufactured by performing the same processes as in the above Embodiment or the like.

[Verification of Manufacturing Method]

Using a concrete example, the shape of the banks after formation was verified for the manufacturing methods of the above Embodiment and Modifications 1 and 2. The results are described with reference to FIGS. 16A and 16B.

Figure 16A:
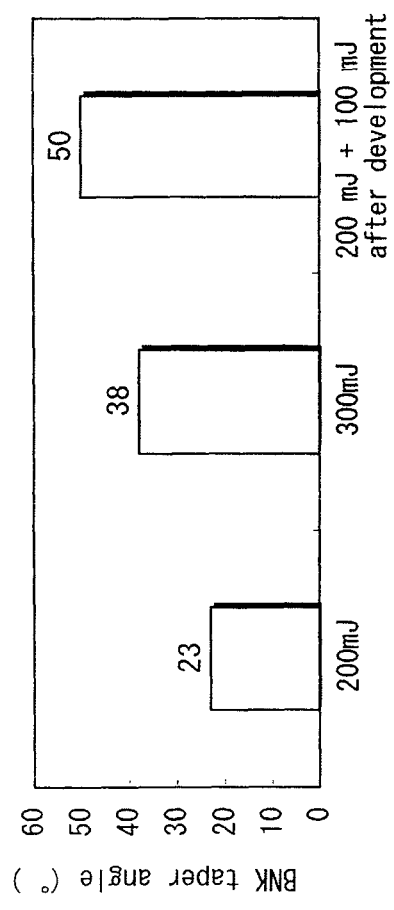
FIG. 16A shows the relationship between the taper angle of a bank and exposure/developing.

As shown in FIG. 16A, the larger the amount of exposure is, the larger the inclination angle of a sidewall of a formed bank is. More specifically, when the exposure and development are performed with 200 mJ of exposure amount, the inclination angle of a sidewall of the formed bank is 23°, whereas when the exposure and development are performed with 300 mJ of exposure amount, the inclination angle of a sidewall of the formed bank is 38°. The results are also shown by the Atomic Force Microscope (AFM) in FIG. 16B.

Figure 16B:
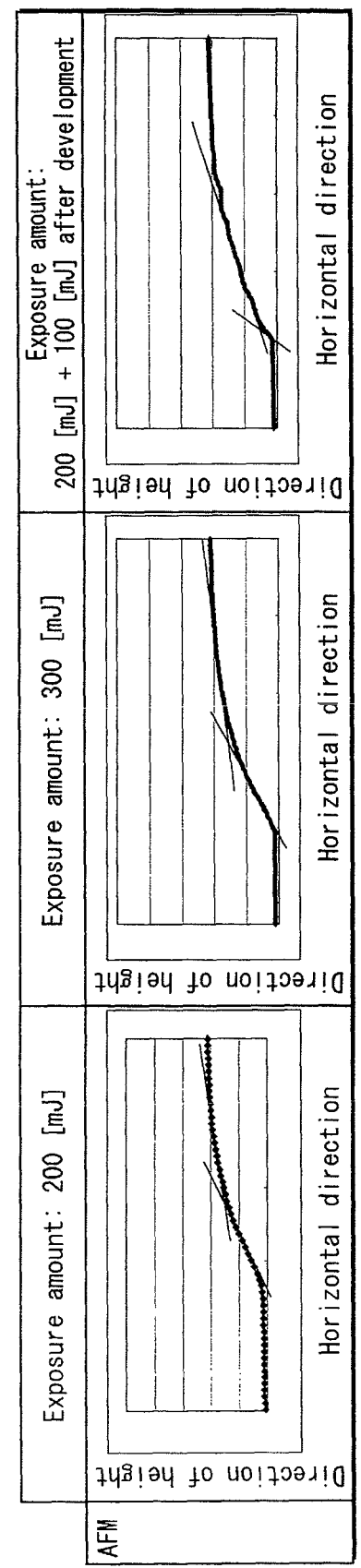
FIG. 16B shows AFM graphs that indicate the shapes of formed banks.

Furthermore, as shown in FIGS. 16A and 16B, when the exposure and development in the first round is performed with 200 mJ of exposure amount and then the exposure and development in the second round is performed with 100 mJ of exposure amount, the inclination angle of a sidewall of the formed bank is 50°. This corresponds to the manufacturing method of Modification 2 and is considered to be effective in creating a large inclination angle of the bank sidewall.

Note that in FIG. 16B, the horizontal axis represents the horizontal direction, and the vertical axis represents the direction of height.

[Embodiment 2]

The following describes an overall structure of the display device in Embodiment 2 with reference to FIGS. 17 and 18.

1. Structure of Display Panel 30

As shown in FIG. 17, in the display panel 30, as in the display panel 10 in Embodiment 1, anodes 102 are formed above a TFT substrate (hereinafter simply referred to as a "substrate") 101 in one-to-one correspondence with the sub-pixels 300a, 300b and 300c, and on each of the anodes 102, an electrode coating layer 103 is formed, and a hole injection transporting layer 104 is layered on the electrode coating layers 103.

Above the hole injection transporting layer 104, banks 305a, 305b, 305c, and 305d are formed from insulating material to define the sub-pixels 300a, 300b, and 300c. An organic light-emitting layer is formed in each region of the sub-pixels 300a, 300b, and 300c defined by the banks 305a, 305b, 305c, 305d, and an electron injection layer, a cathode, and a passivation layer are layered above the organic light-emitting layer in this order (illustration of these is omitted in FIG. 17).

In the display panel 30 of the present embodiment, as is the case with the display panel 10 in the above-described Embodiment 1, a pixel is composed of three sub-pixels 300a, 300b, and 300c. In addition, in the display panel 30 of the present embodiment, non-light-emitting cells 300d and 300e are provided between the pixel and the adjacent pixels on both sides.

More specifically, as illustrated in FIG. 17, each of the non-light-emitting cells 300d and 300e has an electrode (bus bar) 302, which is made of the same material as the anode 102, and an electrode coating layer 303 covering the electrode 302. A hole injection transporting layer 104 is formed to cover each stack of the layers including the electrode coating layer 303. A cathode 108 (not illustrated) is formed on the hole injection transporting layer 104 such that the electrode 302 and the cathode 108 are electrically connected. Note that the organic light-emitting layer 106 is not formed in the non-light-emitting cells 300d and 300e. The above structure makes it possible to lower the electric resistance of the cathode 108 that is composed of ITO and the like, thereby preventing a voltage drop from occurring.

As illustrated in FIG. 17, in the display panel 30 of the present embodiment, side walls 305aa, 305ba, 305bb, 305cb, 305cc, and 305dc of the banks 305a, 305b, 305c, and 305d respectively form angles θ3aa, θ3ba, θ3bb, θ3cb, θ3cc, and θ3dc with the surface of the hole injection transporting layer 104 as an underlying layer.

Here, in the present embodiment, the angles θ3aa, θ3ba, θ3bb, θ3cb, θ3cc, and θ3dc satisfy the relationships represented by the following expressions.

$$\theta 3cb > \theta 3aa = \theta 3ba = \theta 3bb = \theta 3cc \quad \text{[Expression 7]}$$

$$\theta 3dc > \theta 3aa = \theta 3ba = \theta 3bb = \theta 3cc \quad \text{[Expression 8]}$$

Note that, in the present embodiment, the angles θ3aa, θ3ba, θ3bb, θ3cb, θ3cc, and θ3dc are preferably set to the following ranges.

$$25° < \theta 3aa = \theta 3ba = \theta 3bb = \theta 3cc < 35° \quad \text{[Expression 9]}$$

$$35° < \theta 3cb < 45° \quad \text{[Expression 10]}$$

$$35° < \theta 3dc < 45° \quad \text{[Expression 11]}$$

The reason why the inclination angles θ3aa, θ3ba, θ3bb, θ3cb, θ3cc, and θ3dc of the side walls 305aa, 305ba, 305bb, 305cb, 305cc, and 305dc of the banks 305a, 305b, 305c, and 305d are defined by the above-described Expressions 7 to 11 is that the non-light-emitting cells 300d and 300e are provided between a pixel and the adjacent pixels on both sides. Description of this is provided in connection with application of inks 3060a, 3060b, and 3060c.

2. Manufacturing Method of Display Panel 30

Figure 18A:
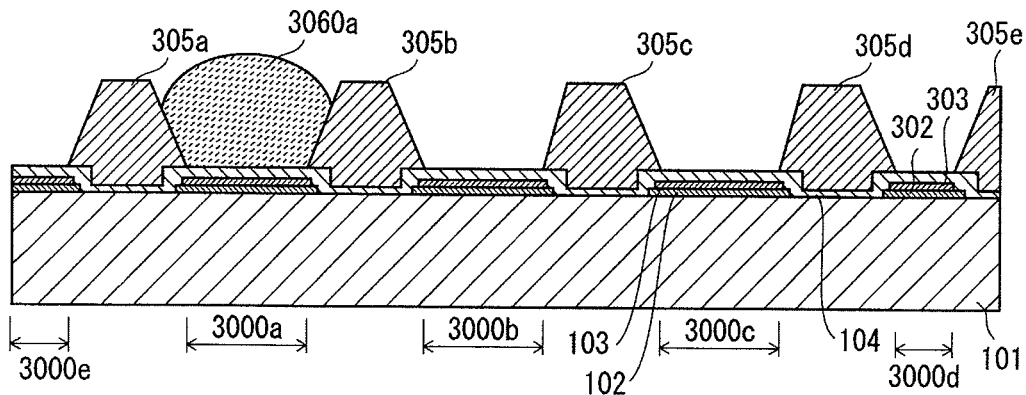
FIGS. 18A-18C are schematic cross-sectional views showing, in order, the processes for applying the inks 3060A-3060C.
Figure 18B:
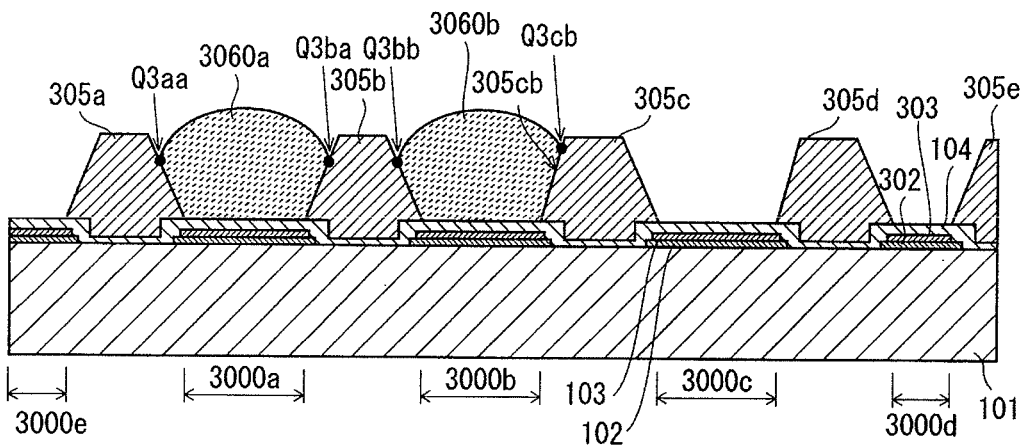
Figure 18C:
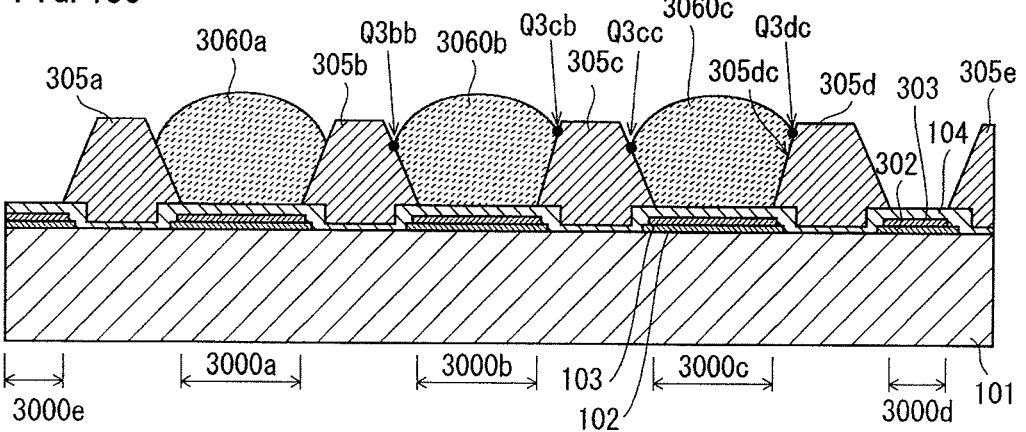

The following describes the characteristic steps of the manufacturing method of the display panel 30 according to the present Embodiment with reference to FIGS. 18A to 18C. Note that the steps other than those illustrated in FIGS. 18A to 18C are the same as those of Embodiment 1.

As shown in FIG. 18A, ink 3060a that includes an organic light-emitting material is dripped into the opening (planned sub-pixel formation region 3000a) defined by the banks 305a and 305b by the inkjet method or other method. When the ink 3060a is applied to the region between the banks 305a and 305b, ink has not been applied to the left-hand side of the bank 305a and the right-hand side of the bank 305b, and thus the vapor concentration distribution is substantially uniform.

Following this, as shown in FIG. 18B, ink 3060b that includes an organic light-emitting material is dripped into the opening (planned sub-pixel formation region 3000b) defined by the banks 305b and 305c by the inkjet method or other method. Here, as described above, inclination angle θ3cb of the sidewall 305cb of the bank 305c (see FIG. 17) is set to satisfy the relationships represented by the above-described Expression 7 (to be relatively larger than the other inclination angles). As a result, the pinning location Q3cb of the ink 3060b in the side wall 305cb of the bank 305c is higher in position than the pinning locations Q3aa, Q3ba, and Q3bb.

Subsequently, as shown in FIG. 18C, ink 3060c that includes an organic light-emitting material is dripped into the opening (planned sub-pixel formation region 3000c) defined by the banks 305c and 305d by the inkjet method or other method. Here, in the present embodiment, the non-light-emitting cell 3000d, to which ink is not applied, is present on the right-hand side of the planned sub-pixel formation region 3000c. Accordingly, the vapor concentration is lower in the right-hand side of the planned sub-pixel formation region 3000c than in the left-hand side. For this reason, as is the case with the inclination angle θ3cb of the sidewall 305cb of the bank 305c, the inclination angle θ3dc of the sidewall 305dc of the bank 305d on the planned sub-pixel formation region 3000c side (see FIG. 17) is set to satisfy the relationships represented by the above-described Expressions 7 and 8 (to be relatively larger than the other inclination angles). As a result, the pinning location Q3dc of the ink 3060c in the side wall 305dc of the bank 305d, as well as the pinning location Q3cb of the ink 3060b, is higher in position than the other pinning locations.

Note that, although omitted from the drawings, subsequently, the display panel 30 is formed by layering, in order, the electron injection layer, cathode, passivation layer, etc.

With the above-described structure, even in the case where the non-light-emitting cells 300d and 300e are provided between a pixel and the adjacent pixels on both sides, it is possible to prevent the organic light-emitting layer from becoming uneven in film thickness in all sub-pixels 300a, 300b, and 300c, and thus it is possible to provide the display panel 30 having high light transmissivity.

Note that the structures other than those described in the present embodiment are the same as those of Embodiment 1.

[Embodiment 3]

Figure 19:
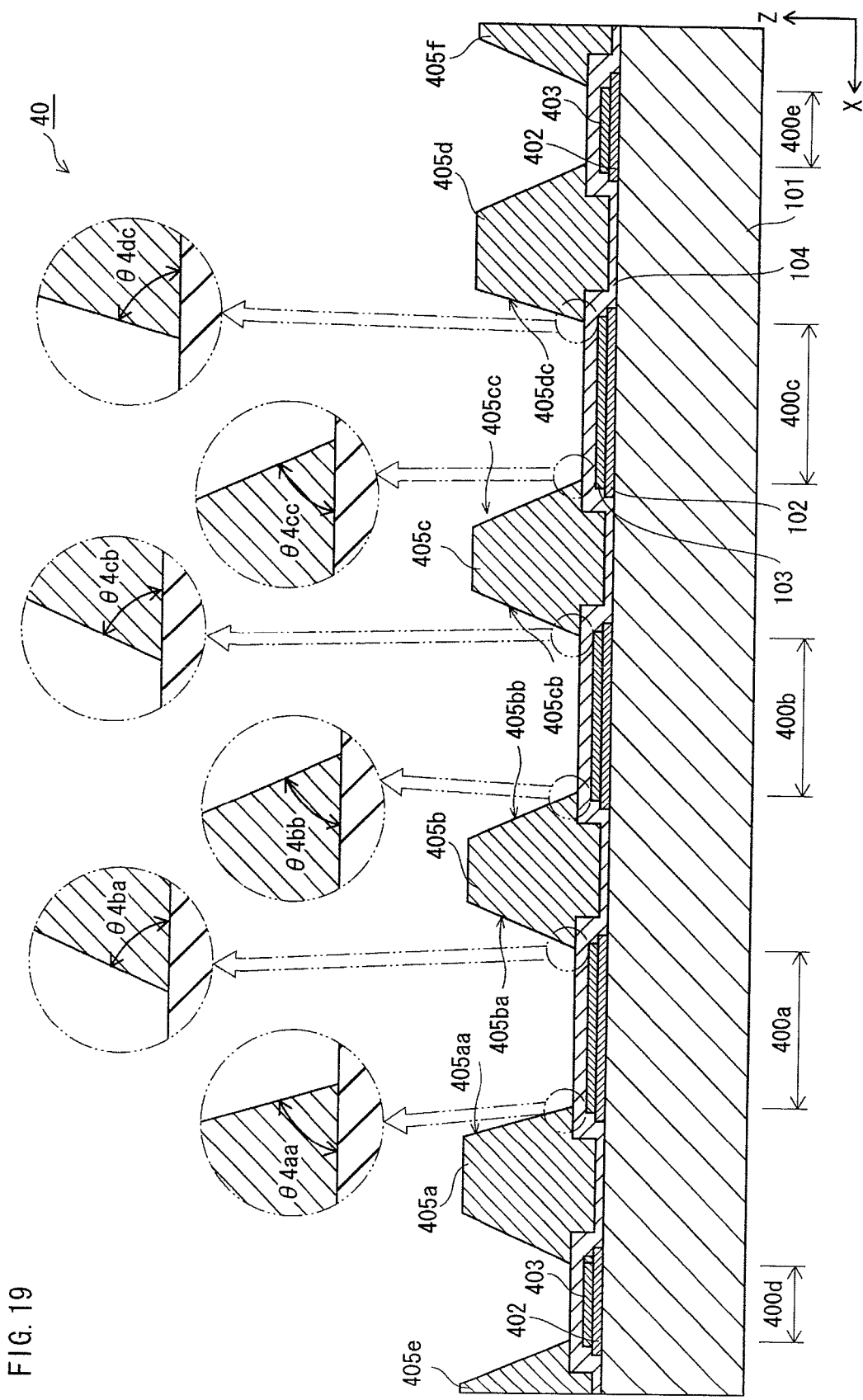
FIG. 19 is a schematic cross-sectional view showing the structure of sub-pixels 400a-400c, non-light-emitting cells 400d and 400e, and banks 405a-405f included in the display panel provided in the organic light-emitting device of Embodiment 3.
Figure 20:
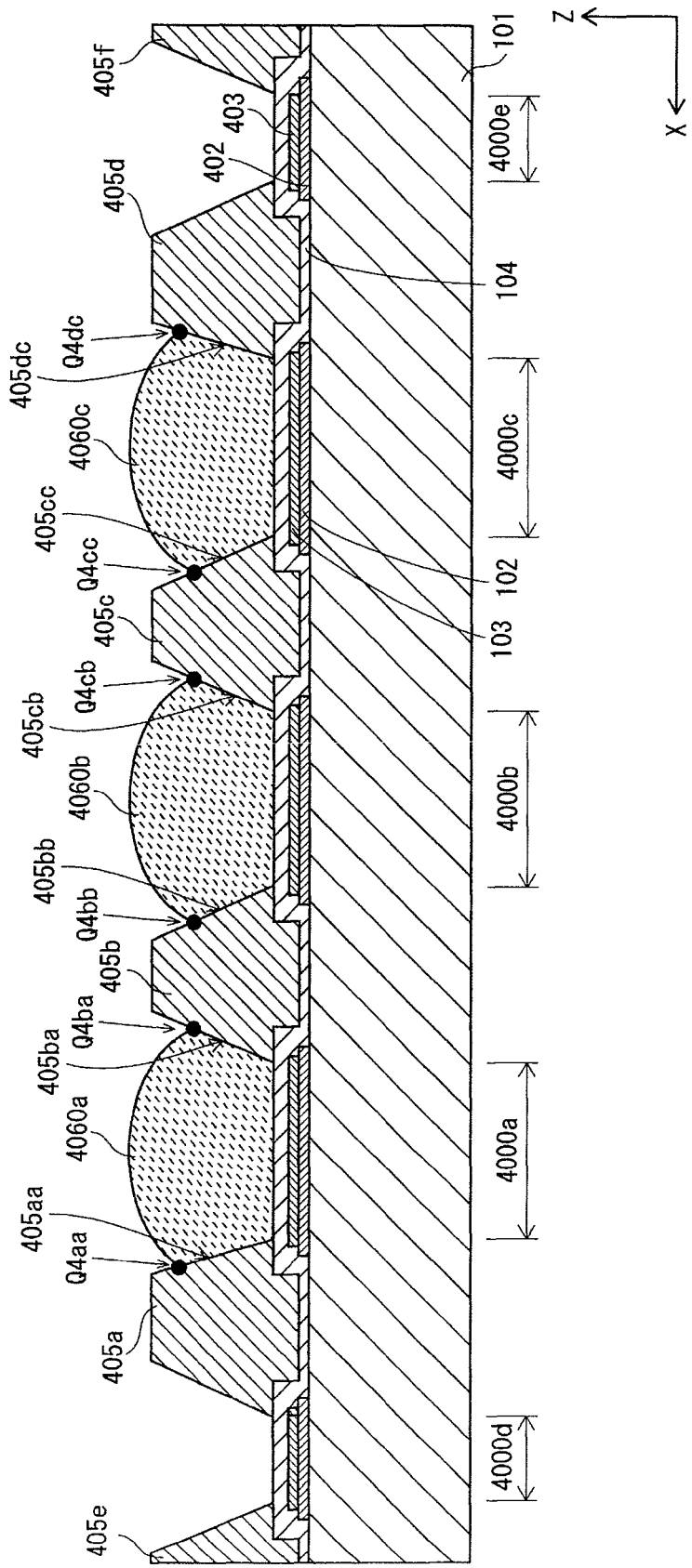
FIG. 20 is a schematic cross-sectional view showing the state where the inks 4060a-4060c are applied at the same time.

The following describes an overall structure of the display device in Embodiment 3 with reference to FIGS. 19 and 20.

1. Structure of Display Panel 40

As shown in FIG. 19, in the display panel 40, as in the display panel 10 in Embodiment 1, anodes 102 are formed above a TFT substrate (hereinafter simply referred to as a "substrate") 101 in one-to-one correspondence with the sub-pixels 400a, 400b and 400c, and on each of the anodes 102, an electrode coating layer 103 is formed, and a hole injection transporting layer 104 is layered on the electrode coating layers 103.

Above the hole injection transporting layer 104, banks 405a, 405b, 405c, and 405d are formed from insulating material to define the sub-pixels 400a, 400b, and 400c. An organic light-emitting layer is formed in each region of the sub-pixels 400a, 400b, and 400c defined by the banks 405a, 405b, 405c, 405d, and an electron injection layer, a cathode, and a passivation layer are layered above the organic light-emitting layer in this order (illustration of these is omitted in FIG. 19).

In the display panel 40 of the present embodiment, as is the case with the display panel 30 in the above-described Embodiment 2, a pixel is composed of three sub-pixels 400a, 400b, and 400c. In addition, in the display panel 40 of the present embodiment, non-light-emitting cells 400d and 400e are provided between the pixel and the adjacent pixels on both sides. With regard to the points described above, the display panel 40 is the same as the display panel 30 of Embodiment 2.

A illustrated in FIG. 19, as is the case with Embodiment 2, each of the non-light-emitting cells 400d and 400e has an electrode (bus bar) 402, which is made of the same material as the anode 102, and an electrode coating layer 403 covering the electrode 402. Furthermore, a hole injection transporting layer 104 is formed to cover each stack of the layers including the electrode coating layer 403. A cathode (not illustrated) is formed on the hole injection transporting layer 104 such that the electrode 402 and the cathode are electrically connected. Note that the organic light-emitting layer is not formed in the non-light-emitting cells 400d and 400e. As is the case with Embodiment 2, this structure makes it possible to lower the electric resistance of the cathode that is composed of ITO and the like, thereby preventing a voltage drop from occurring.

As illustrated in FIG. 19, in the display panel 40 of the present embodiment, side walls 405aa, 405ba, 405bb, 405cb, 405cc, and 405dc of the banks 405a, 405b, 405c, and 405d respectively form angles θ4aa, θ4ba, θ4bb, θ4cb, θcc, and θ4dc with the surface of the hole injection transporting layer 104, which is an underlying layer.

Here, in the present embodiment, the angles θ4aa, θ4ba, θ4bb, θ4cb, θcc, and θ4dc satisfy the relationships represented by the following expressions.

$$\theta 4aa > \theta 4ba = \theta 4bb = \theta 4cb = \theta 4cc \quad [\text{Expression 12}]$$

$$\theta 4dc > \theta 4ba = \theta 4bb = \theta 4cb = \theta 4cc \quad [\text{Expression 13}]$$

Note that, in the present embodiment, the angles θ4aa, θ4ba, θ4bb, θ4cb, θ4cc, and θ4dc are preferably set to the following ranges.

$$25° < \theta 4ba = \theta 4bb = \theta 4cb = \theta 4cc < 35° \quad [\text{Expression 14}]$$

$$35° < \theta 4aa < 45° \quad [\text{Expression 15}]$$

$$35° < \theta 4dc < 45° \quad [\text{Expression 16}]$$

The reason why the inclination angles θ4aa, θ4ba, θ4bb, θ4cb, θ4cc, and θ4dc of the side walls 405aa, 405ba, 405bb, 405cb, 405cc, and 405dc of the banks 405a, 405b, 405c, and 405d are defined by the above Expressions 12 to 16 is that the non-light-emitting cells 400d and 400e are provided between a pixel and the adjacent pixels on both sides, and in connection with this, an appropriate method for applying inks 4060a, 4060b, and 4060c is adopted as described below.

2. Manufacturing Method of Display Panel 40

The following describes the characteristic steps of the manufacturing method of the display panel 40 according to the present Embodiment with reference to FIG. 20. Note that the steps other than those illustrated in FIG. 20 are the same as those of Embodiment 1.

As shown in FIG. 20, the following inks are applied to the following openings at the same time by the inkjet method or the like: ink 4060a to the planned sub-pixel formation region 4000a; ink 4060b to the planned sub-pixel formation region 4000b; and ink 4060c to the planned sub-pixel formation region 4000c. At the time when the inks 4060a, 4060b and 4060c are applied, the vapor concentration distribution is uniform between the left-hand and right-hand sides in the X-axis direction only in the planned sub-pixel formation region 4000b which is located at the central region of the pixel.

On the other hand, in the planned sub-pixel formation region 4000a, the vapor concentration distribution is lower on the left-hand side than on the right-hand side due to the presence of the non-light-emitting cell 400d on the left-hand side of the region 4000a in the X-axis direction. Similarly, in the planned sub-pixel formation region 4000c, the vapor concentration distribution is lower on the right-hand side than on the left-hand side due to the presence of the non-light-emitting cell 400e on the right-hand side of the region 4000c in the X-axis direction.

In the present embodiment, the non-light-emitting cells 400d and 400e are present on the left-hand and right-hand sides of the planned sub-pixel formation regions 4000a and 4000c, respectively. In view of this, in the present embodiment, the inclination angles θ4aa and θ4dc of the respective side walls 405aa and 405dc of the banks 405a and 405d are set to be larger than the other inclination angles θ4ba, θ4bb, θ4cb and θ4cc. With this structure, the pinning locations Q4aa and Q4dc of the inks 4060a and 4060c in the respective sidewalls 405aa and 405dc of the banks 105a and 105d become higher in position than the other pinning locations Q4ba, Q4bb, Q4cb and Q4cc.

Note that, although not illustrated, subsequently the ink is dried, and the electron injection layer, cathode, passivation layer, etc, are layered in this order to form the display panel 40.

With the above-described structure, even in the case where the non-light-emitting cells 400d and 400e are each provided between adjacent pixels and the inks 4060a, 4060b and 4060c are applied at the same time, it is possible to restrict the film thickness of the organic light-emitting layer from becoming uneven in each of the sub-pixels 400a, 400b and 400c, and provide the display panel 40 having excellent light-emitting characteristics.

Note that, with regard to the structural elements that are not described in the present embodiment, corresponding structural elements of Embodiment 1 may be applied.

[Other Considerations]

Firstly, in the above Embodiments 1, 2 and 3 and Modifications 1 and 2, it is schematically illustrated that the surface of each sidewall of the banks 105, 105a-105d, 105x, 105y, 305a-305e, and 405a-405e is planar. However, the surface of each sidewall of the banks may not necessarily be planar. For example, FIG. 19A illustrates a bank 605 whose sidewall has two surfaces: a surface extending from a point $P_{61}$ to a point $P_{62}$; and a surface extending from the point $P_{62}$ to a point $P_{63}$. In this case, a pinning location Qy1 during ink application is present on the surface between the points $P_{62}$ and $P_{63}$. Here, an inclination angle θy2 formed between this the surface and a virtual straight line $L_1$ passing through the point $P_6$, is important in the relationship with the pinning location.

Figure 21A:
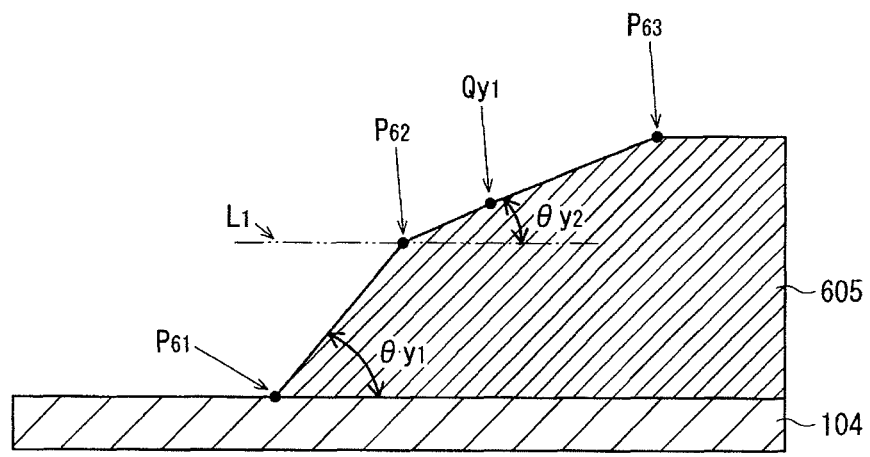
FIGS. 21A and 21B are schematic cross-sectional views provided for explanation of definition of the taper angle.
Figure 21B:
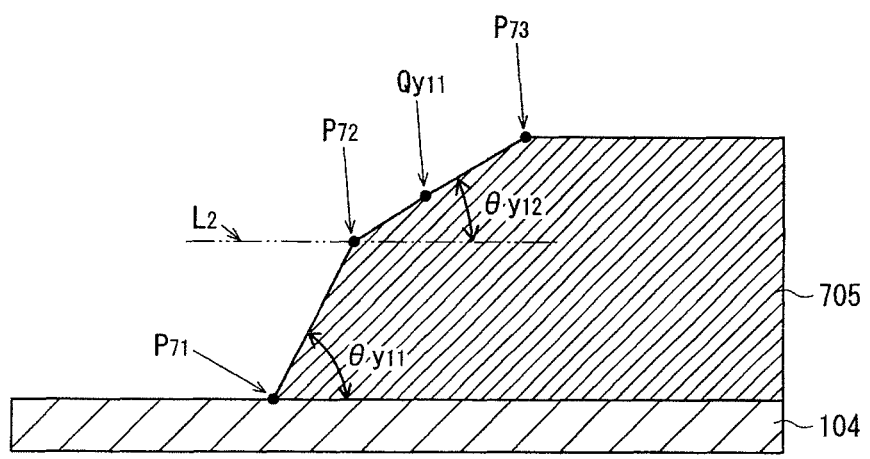

However, the angle θy2 can be controlled by controlling an angle θy1, which is formed between the surface of the underlying layer, namely the hole injection transporting layer 104, and the surface between points $P_{61}$ and $P_6$, of the sidewall of the bank 605, when the bank 605 is formed. Thus, in the actuality, the above effects can be obtained by controlling the inclination angle θy1. For example, if a bank 705 is formed such that an angle θy11 formed between the surface of the hole injection transporting layer 104 and a surface between points $P_{71}$ and $P_{72}$ is larger than the angle θy1 shown in FIG. 21A (see FIG. 21B), then, as shown in FIG. 21B, an angle θy12 formed between a surface between points $P_{72}$ and $P_{73}$ and a virtual straight line $L_2$ also becomes larger than the angle θy2 shown in FIG. 21A.

Figure 22:
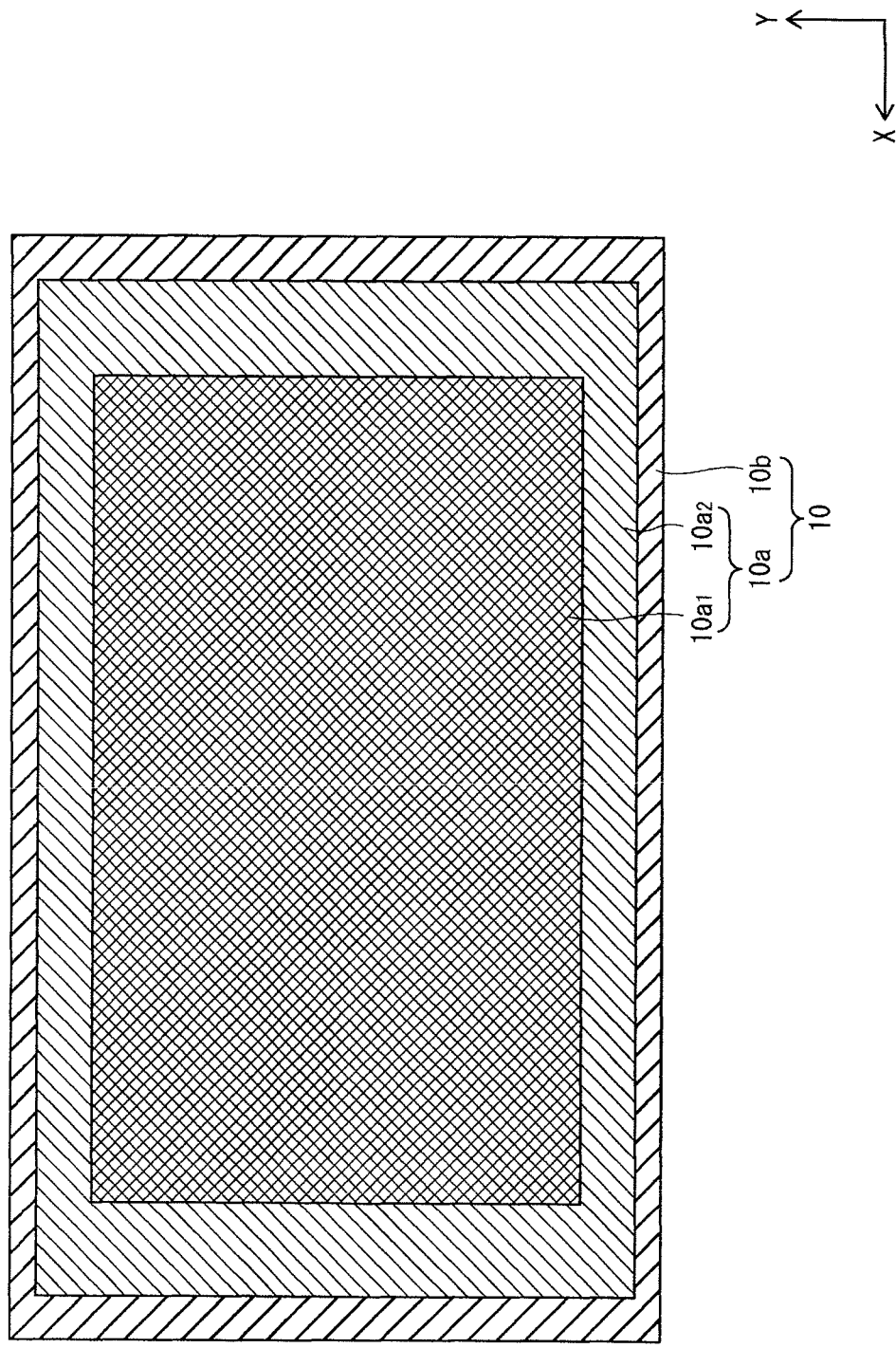
FIG. 22 is a schematic plan view showing regions 10a1, 10a2 and 10b in the display panel 10.

Secondly, in the above Embodiments 1, 2 and 3 and Modifications 1 and 2, it is not specified to what part of the region of the display panel 10, 30 or 40 the above-described structure can be applied. However, the above-described structure may be applied to the entire region of the display panel, or may be applied to a part of the region. As shown in FIG. 22, the display panel 10 can be divided formally into areas 10a and 10b in a direction along the surface of the display panel 10, wherein the area 10a is located at the center, and the area 10b surrounds the area 10a. The area 10a is connected to a source electrode or a drain electrode of the TFT layer below which the anodes are formed, and contributes to the emission of light. On the other hand, the area 10b is not connected to any of the source electrode and drain electrode of the TFT layer below which the anodes are formed, and does not contribute to the emission of light. It is considered that, if the area 10a is further divided formally into a central area 10a1 and a surrounding area 10a2, the uneven film thickness in the organic light-emitting layers of the sub-pixels in the surrounding area 10a2 would be more prominent due to the state of vapor concentration distribution during the application of ink.

Note that the combined area of the surrounding area 10a2 and the area 10b may occupy approximately 0.5% to several percent (for example, 1%) of the total area of the panel. This range is determined by taking account of the variation in film thickness of the organic light-emitting layers when the inclination angles of the bank sidewalls are not adjusted.

In the above Embodiments 1, 2 and 3 and Modifications 1 and 2, the structures are adopted by way of example to clearly explain the structure, acts and effects of the present invention. Accordingly, the present invention is not limited to the above structures, except for such portions that are essential to the present invention. For example, the above Embodiment has adopted, as one example, a structure in which the anodes 102 are located below the organic light-emitting layers 106 in the Z axis direction, as shown in FIG. 2. However, not limited to this structure, the present invention may adopt a structure in which the cathodes 108 are located below the organic light-emitting layers 106 in the Z axis direction.

The display panel has the top-emission structure when it adopts the structure in which the cathodes 108 are located below the organic light-emitting layers 106 in the Z axis direction. In that case, the cathodes 108 become the reflecting electrode layers, and the electrode coating layers 103 are formed above the cathodes 108.

Figure 23:
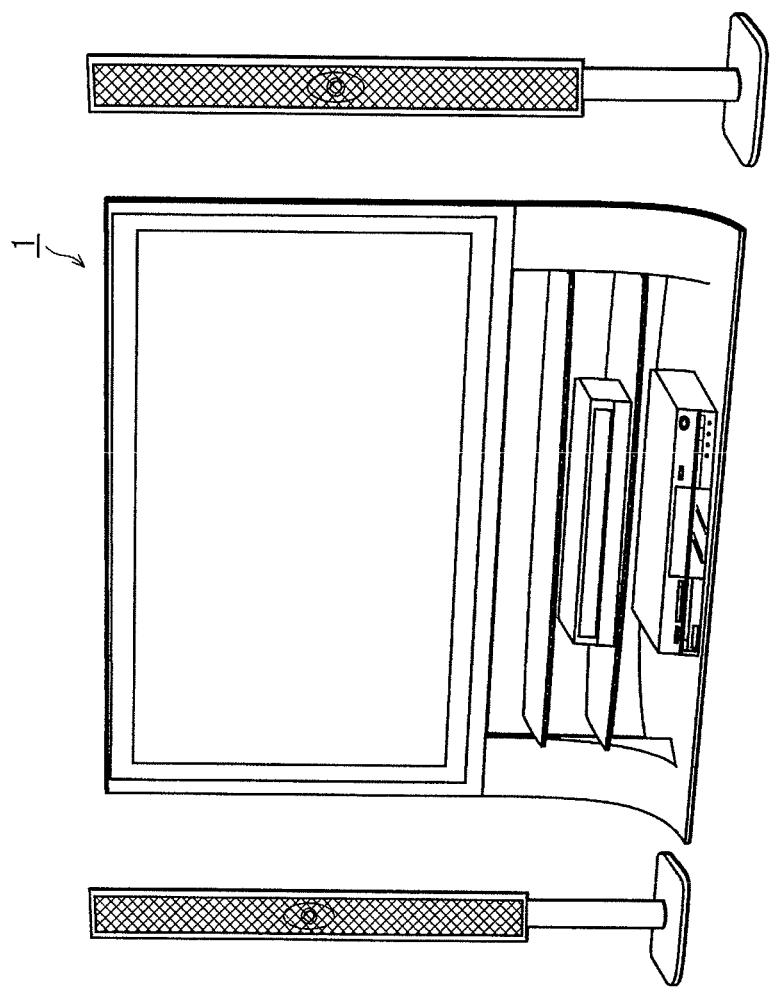
FIG. 23 is an external perspective view showing an example of the appearance of a set that includes the organic display device 1.

Furthermore, the above Embodiments 1, 2 and 3 and Modifications do not provide a specific example of the appearance of the display device 1. However, the display device 1 may be formed as a part of a system illustrated in FIG. 23, for example. Note that an organic EL display device does not require a backlight as a liquid crystal display device does, and thus is suitable for thin display devices and has excellent characteristics from the view point of system design.

Also, in the above Embodiments 1, 2 and 3 and Modifications 1 and 2, a so-called line bank structure is adopted for the banks 105, 105a-105f, 105x, 105y, 305a-305e, 405a-405e, 605, and 705, as shown in FIG. 3. However, not limited to this, the structure of pixel bank 805 shown in FIG. 24 may be adopted. In this structure, a display panel 80 includes the pixel bank 805 which is composed of bank elements 805a and bank elements 805b, wherein the bank elements 805a extend in the Y axis direction and the bank elements 805b extend in the X axis direction.

Figure 24:
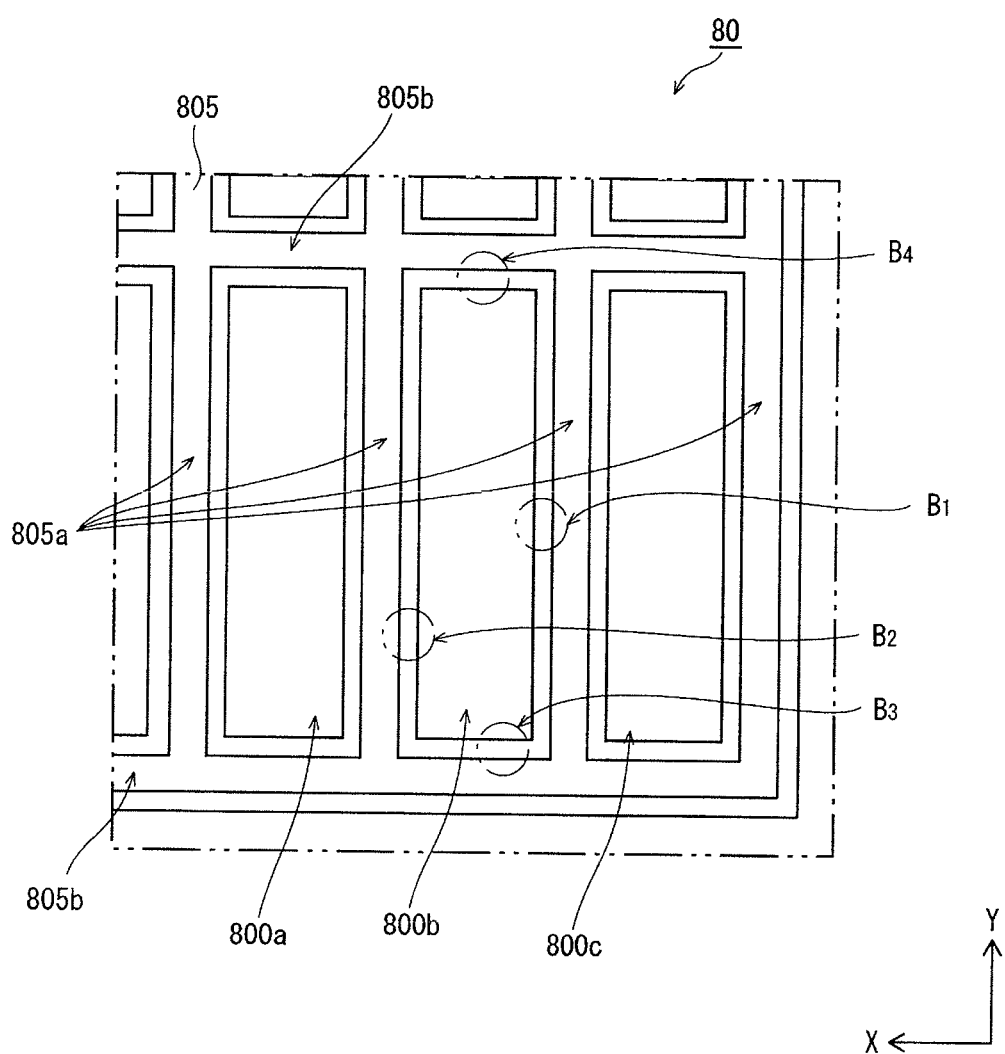
FIG. 24 is a schematic plan view showing a bank 805 in a display panel 80 of Modification 3.

As shown in FIG. 24, when the structure of pixel bank 805 is adopted, the same advantageous effects as the above ones can be obtained by increasing the inclination angles of the sidewalls of the bank 805 in the X and Y axis directions defining the sub-pixels 800a, 800b, and 800c. More specifically, the above advantageous effects can be obtained by appropriately adjusting the inclination angles of the sidewalls indicated by the arrows $B_1$, $B_2$, $B_3$, and $B_4$.

Also, the inclination angles of the sidewalls of the banks adopted in the above Embodiments 1, 2 and 3 and Modifications 1 and 2 may be individually adjusted depending on the vapor concentration distribution observed in the ink application process and drying process when the organic light-emitting layers are formed in the manufacturing process. For example, if the drying device used in the ink drying process has a structure where the vapor flows from the outer circumference of the panel toward the center of the panel, bank sidewalls where the organic light-emitting layers are large in film thickness may have increased inclination angles. This enables the film thickness of the organic light-emitting layers to be uniform, thereby reducing the unevenness in luminance over the entire panel.

In the above Embodiments 1, 2 and 3 and in Modifications 1 and 2, the inclination angle (taper angle) of bank sidewalls is set in the same manner, without distinction between the luminescent colors (red, green, and blue). However, there may be a case where the organic light-emitting materials of the ink for the respective luminescent colors have different characteristics. In that case, the inclination angles of the bank sidewalls may be defined in accordance with the ink characteristics of each luminescent color.

[Industrial Applicability]

The present invention is useful for providing an organic light-emitting panel and an organic display device that exhibit substantially even luminance and are capable of displaying high-quality images.

REFERENCE SIGNS LIST 1 display device
10, 30, 40, 80 display panel
10a1 light-emitting central area
10a2 light-emitting surrounding area
10b dummy area
20 drive control unit
21-24 drive circuit
25 control circuit
100, 100a-100c, 300a-300c, 400a-400c sub-pixel
101 substrate
102 anode
103 electrode coating layer
104 hole injection layer
105, 105a-105d, 105x, 105y, 305a-305e, 405a-405e, 605, 705, 805 bank 106, 106a, 106c, 106x, 106y organic light-emitting layer
107 electron injection layer
108 cathode
109 passivation layer
300d, 300e, 400d, 400e non-light-emitting cell
501-505 mask
1000a-1000c, 3000a-3000c, 4000a-4000c region in which sub-pixel is to be formed
1050, 1051a, 1051b, 1051e, 1051f bank material layer
1060a-1060c, 106θx, 1060y, 3060a-3060c, 4060a-4060c ink
3000d, 3000e, 4000d, 4000e region in which non-light-emitting cell is to be formed

The invention claimed is:

1. An organic light-emitting panel, comprising:
an array of a plurality of pixels;
a plurality of light-emitting cells which, provided in each pixel and arranged in an alignment, emit light of different colors,
each light-emitting cell including an underlying layer, a first electrode provided in the underlying layer, an organic light-emitting layer, and a second electrode formed on an opposite side of the organic light-emitting layer from the underlying layer; and
a plurality of banks which, formed above the underlying layer, define each light-emitting cell by separating the light-emitting cells one from another,
wherein the plurality of pixels includes a pixel that is structured such that two inner sidewalls, which face each other in two adjacent banks defining a predetermined light-emitting cell among the plurality of light-emitting cells, have different inclination angles that are both acute angles, and
each of the different inclination angles of the two inner sidewalls of the two adjacent banks is an angle formed by a corresponding one of the two inner sidewalls and the underlying layer from which each of the two inner sidewalls inclines.

2. The organic light-emitting panel of claim 1, wherein in each of one or more light-emitting cells other than the predetermined light-emitting cell in the pixel that is structured such that the two inner sidewalls facing each other in the two adjacent banks defining the predetermined light-emitting cell have the different inclination angles that are both the acute angles, two inner sidewalls facing each other have equal inclination angles that are both acute angles.

3. The organic light-emitting panel of claim 1, wherein
the plurality of light-emitting cells in each pixel include at least a first light-emitting cell located at an end of the alignment, a second light-emitting cell located at a central portion of the alignment, and a third light-emitting cell located at another end of the alignment,
the plurality of pixels are arranged to be continuously adjacent to each other, and
the plurality of pixels include a pixel that is structured such that
two inner sidewalls, which face each other in two adjacent banks defining the first light-emitting cell, have equal inclination angles that are both acute angles,
two inner sidewalls, which face each other in two adjacent banks defining the second light-emitting cell, have different inclination angles that are both acute angles, and
two inner sidewalls, which face each other in two adjacent banks defining the third light-emitting cell, have equal inclination angles that are both acute angles.

4. The organic light-emitting panel of claim 1, wherein
the plurality of light-emitting cells in each pixel include at least a first light-emitting cell located at an end of the alignment, a second light-emitting cell located at a central portion of the alignment, and a third light-emitting cell located at another end of the alignment,
a non-light-emitting cell is provided between each pair of adjacent pixels,
a bank is provided between each pair of a pixel and a non-light-emitting cell that are adjacent to each other, the bank separating the pixel from the non-light-emitting cell, and
the plurality of pixels include a pixel that is structured such that
two inner sidewalls, which face each other in two adjacent banks defining the first light-emitting cell, have equal inclination angles that are both acute angles,
two inner sidewalls, which face each other in two adjacent banks defining the second light-emitting cell, have different inclination angles that are both acute angles, and
two inner sidewalls, which face each other in two adjacent banks defining the third light-emitting cell, have different inclination angles that are both acute angles.

5. The organic light-emitting panel of claim 1, wherein
the plurality of light-emitting cells in each pixel include at least a first light-emitting cell located at an end of the alignment, a second light-emitting cell located at a central portion of the alignment, and a third light-emitting cell located at another end of the alignment,
a non-light-emitting cell is provided between each pair of adjacent pixels,
a bank is provided between each pair of a pixel and a non-light-emitting cell that are adjacent to each other, the bank separating the pixel from the non-light-emitting cell, and
the plurality of pixels include a pixel that is structured such that
two inner sidewalls, which face each other in two adjacent banks defining the first light-emitting cell, have different inclination angles that are both acute angles,
two inner sidewalls, which face each other in two adjacent banks defining the second light-emitting cell, have equal inclination angles that are both acute angles, and
two inner sidewalls, which face each other in two adjacent banks defining the third light-emitting cell, have different inclination angles that are both acute angles.

6. The organic light-emitting panel of claim 4, wherein each non-light-emitting cell includes none of the organic light-emitting layers and includes the second electrode and a third electrode that is made of a same material as the first electrodes, the third electrode and the second electrode being electrically connected with each other.

7. The organic light-emitting panel of claim 1, wherein
two regions adjacent to the predetermined light-emitting cell have different ink vapor concentrations when ink is applied to the predetermined light-emitting cell, and
among the two inner sidewalls facing each other in the two adjacent banks defining the predetermined light-emitting cell, a sidewall of a bank, which is located on a side of a region having a lower ink vapor concentration among the two regions, has an inclination angle that is an acute angle and larger than an inclination angle of a sidewall of a bank, which is located on a side of a region having a higher ink vapor concentration among the two regions.

8. The organic light-emitting panel of claim 1, wherein
a type of ink corresponding to the predetermined light-emitting cell is applied to the predetermined light-emitting cell in a state where a type of ink corresponding to one light-emitting cell among two light-emitting cells that are, in a same pixel, adjacent to the predetermined light-emitting cell, has been applied to the one light-emitting cell and before another type of ink corresponding to the other light-emitting cell among the two light-emitting cells starts to be applied to the other light-emitting cell, and
a sidewall of a bank located on a side of the other light-emitting cell has an inclination angle that is an acute angle and larger than an inclination angle of a sidewall of a bank located on a side of the one light-emitting cell.

9. The organic light-emitting panel of claim 1, wherein
two regions adjacent to the predetermined light-emitting cell have different ink vapor concentrations when ink is applied to the predetermined light-emitting cell, and
two regions adjacent to a light-emitting cell, which is different from the predetermined light-emitting cell, have equal ink vapor concentrations when ink is applied to the light-emitting cell.

10. The organic light-emitting panel of claim 1, wherein
the plurality of light-emitting cells provided in each pixel include at least a first light-emitting cell located at an end of the alignment, a second light-emitting cell located at a central portion of the alignment, and a third light-emitting cell located at another end of the alignment, each organic light-emitting layer being formed by applying, for each pixel, at least three types of ink, which correspond one-to-one to the different colors of light, respectively to the at least three light-emitting cells in an order of the first light-emitting cell, the second light-emitting cell and the third light-emitting cell,
the plurality of pixels are arranged to be continuously adjacent to each other, and
in each pixel,
two inner sidewalls, which face each other in two adjacent banks defining the first light-emitting cell, have equal inclination angles that are both acute angles,
two inner sidewalls, which face each other in two adjacent banks defining the second light-emitting cell, have different inclination angles that are both acute angles, and
two inner sidewalls, which face each other in two adjacent banks defining the third light-emitting cell, have equal inclination angles that are both acute angles.

11. The organic light-emitting panel of claim 10, wherein
among two inner sidewalls facing each other in two adjacent banks defining the second light-emitting cell, a sidewall of a bank located on a side of the third light-emitting cell has an inclination angle that is an acute angle and larger than an inclination angle of a sidewall of a bank located on a side of the first light-emitting cell.

12. The organic light-emitting panel of claim 11, wherein
the sidewall of the bank located on the side of the first light-emitting cell among the two inner sidewalls facing each other in the two adjacent banks defining the second light-emitting cell, and the two inner sidewalls facing each other in the two adjacent banks defining the first light-emitting cell, have equal inclination angles that are acute angles.

13. The organic light-emitting panel of claim 12, wherein
the sidewall of the bank located on the side of the first light-emitting cell among the two inner sidewalls facing each other in the two adjacent banks defining the second light-emitting cell, and the two inner sidewalls facing each other in the two adjacent banks defining the third light-emitting cell, have equal inclination angles that are acute angles.

14. The organic light-emitting panel of claim 13, wherein
among the two inner sidewalls facing each other in the two adjacent banks defining the second light-emitting cell, the sidewall of the bank located on the side of the third light-emitting cell has an inclination angle of at least 35 degrees and at most 45 degrees,
among the two inner sidewalls facing each other in the two adjacent banks defining the second light-emitting cell, the sidewall of the bank located on the side of the first light-emitting cell has an inclination angle of at least 25 degrees and at most 35 degrees,
each of the two inner sidewalls facing each other in the two adjacent banks defining the first light-emitting cell has an inclination angle of at least 25 degrees and at most 35 degrees, and
each of the two inner sidewalls facing each other in the two adjacent banks defining the third light-emitting cell has an inclination angle of at least 25 degrees and at most 35 degrees.

15. The organic light-emitting panel of claim 1, wherein
the plurality of light-emitting cells provided in each pixel include at least a first light-emitting cell located at an end of the alignment, a second light-emitting cell located at a central portion of the alignment, and a third light-emitting cell located at another end of the alignment, each organic light-emitting layer being formed by applying, for each pixel, at least three types of ink, which correspond one-to-one to the different colors of light, respectively to the at least three light-emitting cells in an order of the first light-emitting cell, the second light-emitting cell and the third light-emitting cell,
a non-light-emitting cell is provided between each pair of adjacent pixels,
a bank is provided between each pair of a pixel and a non-light-emitting cell that are adjacent to each other, the bank separating the pixel from the non-light-emitting cell, and
in each pixel,
two inner sidewalls, which face each other in two adjacent banks defining the first light-emitting cell, have equal inclination angles that are both acute angles,
two inner sidewalls, which face each other in two adjacent banks defining the second light-emitting cell, have different inclination angles that are both acute angles, and
two inner sidewalls, which face each other in two adjacent banks defining the third light-emitting cell, have different inclination angles that are both acute angles.

16. The organic light-emitting panel of claim 15, wherein
among the two inner sidewalls facing each other in the two adjacent banks defining the second light-emitting cell, the sidewall of the bank located on the side of the third light-emitting cell has an inclination angle that is an acute angle and larger than an inclination angle of the sidewall of the bank located on the side of the first light-emitting cell, and
among the two inner sidewalls facing each other in the two adjacent banks defining the third light-emitting cell, the sidewall of the bank located on the side of the non-light-emitting cell has an inclination angle that is an acute angle and larger than an inclination angle of the sidewall of the bank located on the side of the second light-emitting cell.

17. The organic light-emitting panel of claim 16, wherein the sidewall of the bank located on the side of the third light-emitting cell among the two inner sidewalls facing each other in the two adjacent banks defining the second light-emitting cell, and the sidewall of the bank located on the side of the non-light-emitting cell among the inner sidewalls facing each other in the two adjacent banks defining the third light-emitting cell, have equal inclination angles that are both acute angles.

18. The organic light-emitting panel of claim 15, wherein the sidewall of the bank located on the side of the first light-emitting cell among the two inner sidewalls facing each other in the two adjacent banks defining the second light-emitting cell, and the two inner sidewalls facing each other in the two adjacent banks defining the first light-emitting cell, have equal inclination angles that are acute angles.

19. The organic light-emitting panel of claim 18, wherein the sidewall of the bank located on the side of the second light-emitting cell among the two inner sidewalls facing each other in the two adjacent banks defining the third light-emitting cell, and the two inner sidewalls facing each other in the two adjacent banks defining the first light-emitting cell, have equal inclination angles that are acute angles.

20. The organic light-emitting panel of claim 18, wherein
among the two inner sidewalls facing each other in the two adjacent banks defining the second light-emitting cell, the sidewall of the bank located on the side of the third light-emitting cell has an inclination angle of at least 35 degrees and at most 45 degrees,
among the two inner sidewalls facing each other in the two adjacent banks defining the third light-emitting cell, the sidewall of the bank located on the side of the non-light-emitting cell has an inclination angle of at least 35 degrees and at most 45 degrees,
among the two inner sidewalls facing each other in the two adjacent banks defining the second light-emitting cell, the sidewall of the bank located on the side of the first light-emitting cell has an inclination angle of at least 25 degrees and at most 35 degrees,
among the two inner sidewalls facing each other in the two adjacent banks defining the third light-emitting cell, the sidewall of the bank located on the side of the second light-emitting cell has an inclination angle of at least 25 degrees and at most 35 degrees, and
each of the two inner sidewalls facing each other in the two adjacent banks defining the first light-emitting cell has an inclination angle of at least 25 degrees and at most 35 degrees.

21. The organic light-emitting panel of claim 1, wherein
the plurality of light-emitting cells provided in each pixel include at least a first light-emitting cell located at an end of the alignment, a second light-emitting cell located at a central portion of the alignment, and a third light-emitting cell located at another end of the alignment, each organic light-emitting layer being formed by applying, for each pixel, at least three types of ink, which correspond one-to-one to the different colors of light, respectively to the at least three light-emitting cells at the same time,
a non-light-emitting cell is provided between each pair of adjacent pixels,
a bank is provided between each pair of a pixel and a non-light-emitting cell that are adjacent to each other, the bank separating the pixel from the non-light-emitting cell, and
in each pixel,
two inner sidewalls, which face each other in two adjacent banks defining the first light-emitting cell, have different inclination angles that are both acute angles,
two inner sidewalls, which face each other in two adjacent banks defining the second light-emitting cell, have equal inclination angles that are both acute angles, and
two inner sidewalls, which face each other in two adjacent banks defining the third light-emitting cell, have different inclination angles that are both acute angles.

22. The organic light-emitting panel of claim 21, wherein
among the two inner sidewalls facing each other in the two adjacent banks defining the first light-emitting cell, the sidewall of the bank located on the side of the non-light-emitting cell has an inclination angle that is an acute angle and larger than an inclination angle of the sidewall of the bank located on the side of the second light-emitting cell, and
among the two inner sidewalls facing each other in the two adjacent banks defining the third light-emitting cell, the sidewall of the bank located on the side of the non-light-emitting cell has an inclination angle that is an acute angle and larger than an inclination angle of the sidewall of the bank located on the side of the second light-emitting cell.

23. The organic light-emitting panel of claim 22, wherein the sidewall of the bank located on the side of the non-light-emitting cell among the two inner sidewalls facing each other in the two adjacent banks defining the first light-emitting cell, and the sidewall of the bank located on the side of the non-light-emitting cell among the inner sidewalls facing each other in the two adjacent banks defining the third light-emitting cell, have equal inclination angles that are both acute angles.

24. The organic light-emitting panel of claim 21, wherein the sidewall of the bank located on the side of the second light-emitting cell among the two inner sidewalls facing each other in the two adjacent banks defining the first light-emitting cell, and the two inner sidewalls facing each other in the two adjacent banks defining the second light-emitting cell, have equal inclination angles that are acute angles.

25. The organic light-emitting panel of claim 24, wherein the sidewall of the bank located on the side of the second light-emitting cell among the two inner sidewalls facing each other in the two adjacent banks defining the third light-emitting cell, and the two inner sidewalls facing each other in the two adjacent banks defining the second light-emitting cell, have equal inclination angles that are acute angles.

26. The organic light-emitting panel of claim 25, wherein
among the two inner sidewalls facing each other in the two adjacent banks defining the first light-emitting cell, the sidewall of the bank located on the side of the non-light-emitting cell has an inclination angle of at least 35 degrees and at most 45 degrees,
among the two inner sidewalls facing each other in the two adjacent banks defining the third light-emitting cell, the sidewall of the bank located on the side of the non-light-emitting cell has an inclination angle of at least 35 degrees and at most 45 degrees,
among the two inner sidewalls facing each other in the two adjacent banks defining the first light-emitting cell, the sidewall of the bank located on the side of the second light-emitting cell has an inclination angle of at least 25 degrees and at most 35 degrees, among the two inner sidewalls facing each other in the two adjacent banks defining the third light-emitting cell, the sidewall of the bank located on the side of the second light-emitting cell has an inclination angle of at least 25 degrees and at most 35 degrees, and each of the two inner sidewalls facing each other in the two adjacent banks defining the second light-emitting cell has an inclination angle of at least 25 degrees and at most 35 degrees.

27. The organic light-emitting panel of claim 1, wherein each of the different inclination angles is an angle formed by a side wall of a bank and an upper surface of the underlying layer on which the bank is provided.

28. The organic light-emitting panel of claim 1, wherein the underlying layer includes a TFT layer formed below the first layer, and in the pixel that is structured such that the two inner sidewalls facing each other in the two adjacent banks defining the predetermined light-emitting cell have the different inclination angles, the first electrode and the TFT layer are electrically connected with each other.

29. An organic display device including the organic light-emitting panel defined in claim 1.

30. The organic light-emitting panel of claim 1, wherein an inclination angle of each of the two inner sidewalls of the two adjacent banks is uniform from the underlying layer to an upper surface of a corresponding one of the two adjacent banks.

31. The organic light-emitting panel of claim 1, wherein each of the two inner sidewalls of the two adjacent banks includes at least two surfaces that form different inclination angles with respect to the underlying layer on which the two adjacent banks are formed.

32. A manufacturing method of an organic light-emitting panel including an array of a plurality of pixels, the manufacturing method comprising:

forming, on a substrate, an underlying layer including a plurality of first electrodes;

layering a photoresist material on the underlying layer;

forming, for each pixel of the plurality of pixels, a plurality of openings corresponding to a plurality of light-emitting cells by performing an exposure with a mask laid on the layered photoresist material to form a pattern, and forming a plurality of banks to define each light-emitting cell by separating the light-emitting cells one from another;

forming a plurality of organic light-emitting layers by dripping ink that includes organic light-emitting materials into the plurality of openings corresponding to the plurality of light-emitting cells, and drying the ink; and forming a second electrode above each organic light-emitting layer, wherein in the forming of the plurality of openings, at least one pixel among the plurality of pixels is formed such that two inner sidewalls, which face each other in two adjacent banks defining a predetermined light-emitting cell among the plurality of light-emitting cells, have different inclination angles that are both acute angles, and each of the different inclination angles of the two inner sidewalls of the two adjacent banks is an angle formed by a corresponding one of the two inner sidewalls and the underlying layer from which each of the two inner sidewalls inclines.

33. The manufacturing method of claim 32, wherein in the forming of the plurality of openings, the at least one pixel is formed such that two inner sidewalls, which face each other in two adjacent banks defining a light-emitting cell other than the predetermined light-emitting cell, have equal inclination angles that are both acute angles.

34. The manufacturing method of claim 32, wherein in the forming of the plurality of openings, when the exposure of the photoresist material is performed, the two inner sidewalls facing each other in the two adjacent banks defining the predetermined light-emitting cell are formed to have the different inclination angles, by causing portions of the photoresist material corresponding to the two inner sidewalls of the two adjacent banks defining the predetermined light-emitting cell to be exposed to different amounts of light.

35. The manufacturing method of claim 32, wherein in the forming of the plurality of openings, when the exposure of the photoresist material is performed, the two inner sidewalls facing each other in the two adjacent banks defining the predetermined light-emitting cell are formed to have the different inclination angles, by using masks that are different in light transmissivity at portions of the photoresist material corresponding to the two inner sidewalls of the two adjacent banks defining the predetermined light-emitting cell.

36. The manufacturing method of claim 32, wherein in the forming of the plurality of openings, after the photoresist material is exposed and developed, the two inner sidewalls facing each other in the two adjacent banks defining the predetermined light-emitting cell are formed to have the different inclination angles, by additionally performing an exposure process onto a portion of the photoresist material corresponding to one of the two inner sidewalls facing each other in the two adjacent banks defining the predetermined light-emitting cell.

37. An organic display device including the organic light-emitting panel manufactured by the manufacturing method defined in claim 32.

* * * * *